(12) United States Patent
Isham et al.

(10) Patent No.: US 8,188,721 B2
(45) Date of Patent: May 29, 2012

(54) ACTIVE PULSE POSITIONING MODULATOR

(75) Inventors: Robert H. Isham, Flemington, NJ (US); Weihong Qiu, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 389 days.

(21) Appl. No.: 12/492,397

(22) Filed: Jun. 26, 2009

(65) Prior Publication Data

US 2010/0141225 A1    Jun. 10, 2010

Related U.S. Application Data

(60) Provisional application No. 61/086,315, filed on Aug. 5, 2008.

(51) Int. Cl.
*G05F 1/40* (2006.01)
(52) U.S. Cl. .......................... 323/282; 323/288; 332/109
(58) Field of Classification Search .......... 323/220–226, 323/234, 265.272, 282–288; 363/41, 16, 363/17; 327/175; 332/109
See application file for complete search history.

(56) References Cited

U.S. PATENT DOCUMENTS

| | | | |
|---|---|---|---|
| 6,057,675 A | 5/2000 | Tateishi | |
| 6,144,194 A * | 11/2000 | Varga | 323/285 |
| 6,342,822 B1 * | 1/2002 | So | 332/109 |
| 7,254,000 B1 * | 8/2007 | Smith et al. | 361/56 |
| 7,301,400 B1 * | 11/2007 | Dening | 330/276 |
| 7,453,246 B2 * | 11/2008 | Qiu et al. | 323/282 |
| 7,893,669 B2 * | 2/2011 | Osterhout et al. | 323/272 |
| 2003/0090244 A1 | 5/2003 | Shenai et al. | |

OTHER PUBLICATIONS

Zheren, Lai et al. "A General Constant-Frequency Pulsewidth Modulator and Its Applications." IEEE Transactions on Circuits and Systems Part I: Regular Papers, IEEE Service Center, New York, NY, US. vol. 45, No. 4, Apr. 1, 1998. XP011011721, ISSN: 1057-7122. pp. 387-389.

* cited by examiner

*Primary Examiner* — Rajnikant Patel
(74) *Attorney, Agent, or Firm* — Gary Stanford

(57) ABSTRACT

An adaptive pulse positioning modulator including a sense circuit which provides a compensation signal indicative of output voltage error, a filter circuit having an input receiving the compensation signal and an output providing an adjust signal, a leading ramp circuit which provides a repetitive first leading edge ramp signal having a slope which is adjusted by the adjust signal, a comparator circuit which provides a first start trigger signal when the first leading edge ramp signal reaches the compensation signal and a first end trigger signal when a first trailing edge ramp signal reaches the compensation signal, a trailing ramp circuit which initiates ramping of the first trailing edge ramp signal when the first start trigger signal is provided, and a pulse control logic which asserts pulses on a PWM signal based on the trigger signals.

22 Claims, 14 Drawing Sheets

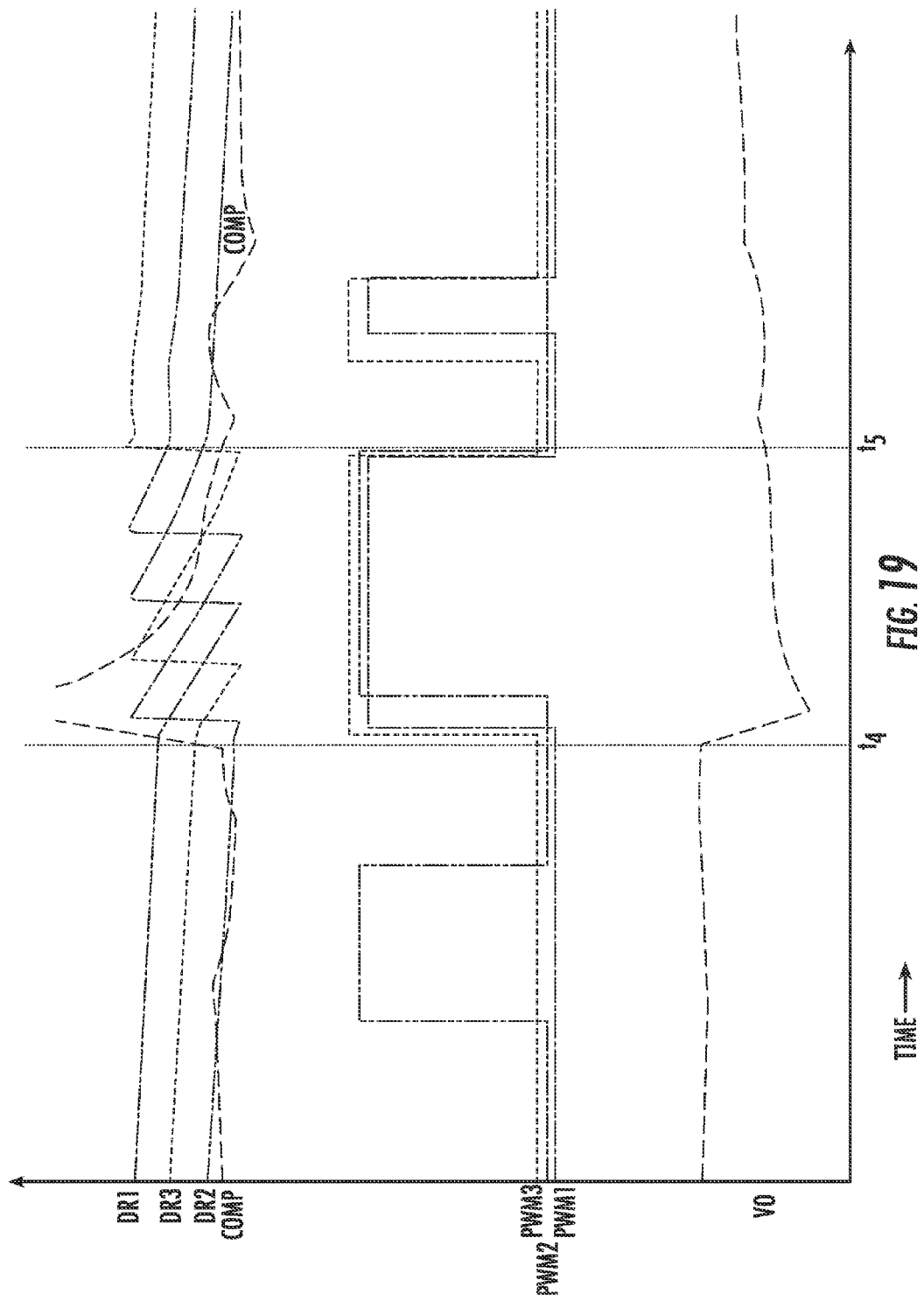

ACTIVE PULSE POSITIONING MODULATOR

CROSS-REFERENCE TO RELATED APPLICATIONS

This application claims the benefit of U.S. Provisional Application Ser. No. 61/086,315, filed on Aug. 5, 2008, which is hereby incorporated by reference in its entirety for all intents and purposes. The present invention is related to U.S. Pat. No. 7,453,250 issued Nov. 18, 2008 which is hereby incorporated by reference in its entirety for all intents and purposes.

BRIEF DESCRIPTION OF THE DRAWINGS

The benefits, features, and advantages of the present invention will become better understood with regard to the following description, and accompanying drawings where:

FIGS. 18 and 19 are timing diagrams illustrating operation of a 3-channel APP regulator using the down ramp generator of FIG. 10 with the speed up filter circuit of FIG. 17, and further using the APP controller of FIG. 12 according to an exemplary embodiment.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
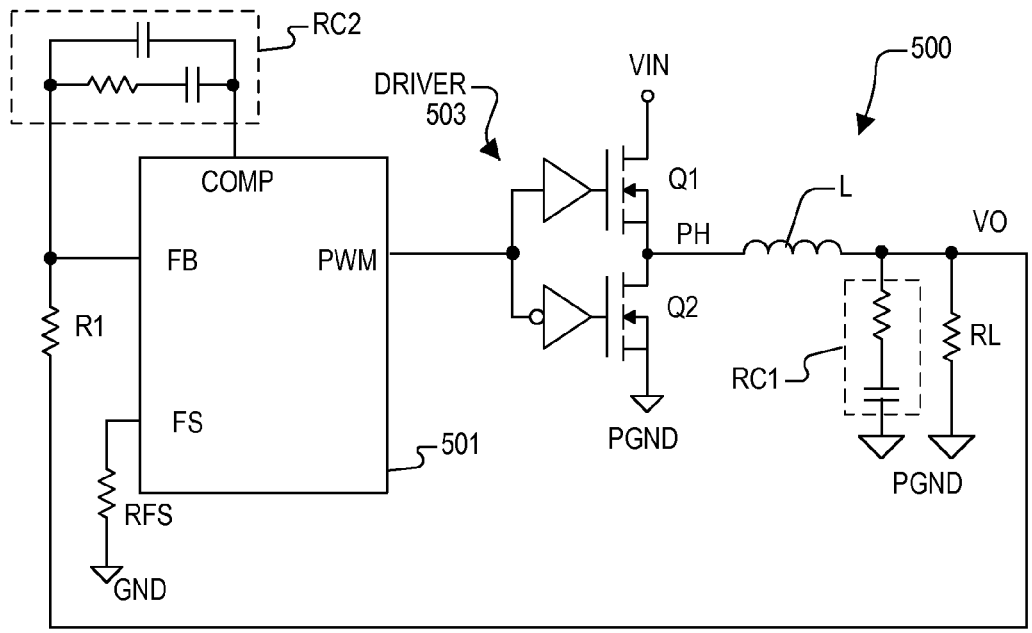
FIG. 1 is a block diagram of an exemplary DC-DC buck converter employing a single-phase voltage mode controller implemented according to an exemplary embodiment.

FIG. 1 is a block diagram of an exemplary DC-DC buck converter 500 employing a single-phase voltage mode controller 501 implemented according to an exemplary embodiment. The controller 501 has a PWM pin coupled to an input of a driver circuit 503, which drives the gates of electronic switches Q1 and Q2 having controlled current paths coupled between an input voltage VIN and power ground (PGND). The switches Q1, Q2 are designated with Q reference numbers and schematically shown as simplified representations of field-effect transistors (FETs), where it is understood that the switches Q1, Q2 may be implemented as any suitable electronic switching devices, such as N-channel devices, P-channel devices, metal-oxide semiconductor FETs (MOSFETs), bipolar-junction transistors (BJTs), insulated gate bipolar transistors (IGBTs), or any other electronic switch configuration as known to those skilled in the art. In this example, the drain of Q1 is coupled to VIN and its source is coupled to a phase node PH, which is coupled to the drain of Q2. The source of Q2 is coupled to PGND. A node and the signal it carries assume the same name unless otherwise specified. The PH node is coupled to one end of an output inductor L, having its other end coupled to an output voltage node VO (developing an output signal VO). VO is filtered by the inductance L and a capacitor circuit RC1 which is coupled across a load resistor RL between VO and PGND. The resistor within RC1 is a series resistance of the capacitor and minimized as much as possible. VO is fed back through a resistor R1 to a feedback pin FB of the controller 501. Another resistor-capacitor circuit RC2 is coupled between the FB pin and a compensation pin COMP of the controller 501. A frequency set resistor RFS is coupled between a frequency set pin FS of the controller 501 and signal ground (GND). As understood by those skilled in the art, Q1 is turned on while Q2 is off to couple VIN through the inductor L to develop the output signal VO, then Q1 is turned off and Q2 turned on to couple L to GND, and this switching process is repeated as controlled by the PWM output of the controller 501. The frequency of the clock signal generally controlling the PWM cycles is programmable within a certain range as determined by the resistor RFS. The frequency set function is only one of many frequency determination methods, such as, for example, an internal reference signal (current or voltage) or the like. An internal reference signal avoids the use of the external frequency set pin FS.

Figure 2:
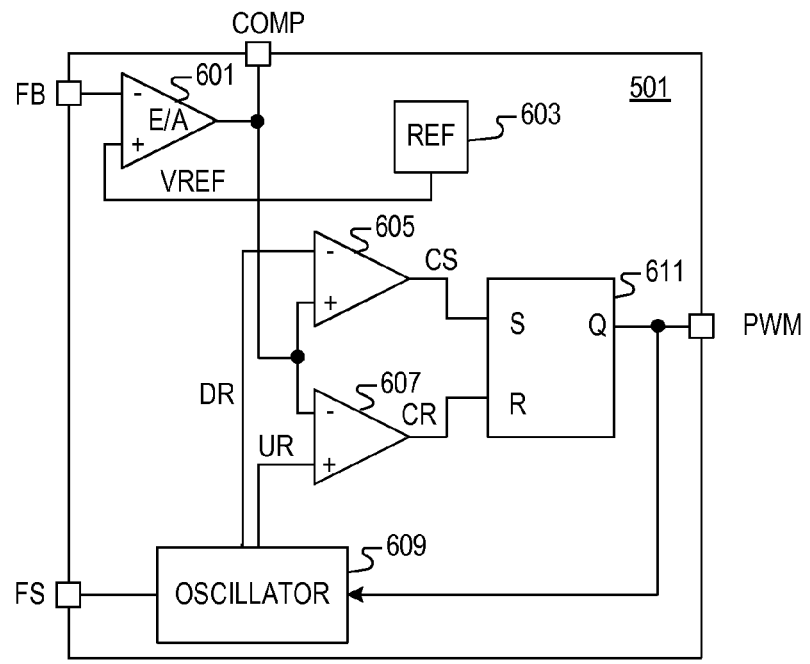
FIG. 2 is a simplified block diagram of an exemplary embodiment of the single-phase voltage mode controller of FIG. 1 implemented with a dual-edge modulation scheme using dual ramps according to an exemplary embodiment.

FIG. 2 is a simplified block diagram of an exemplary embodiment of the single-phase voltage mode controller 501 implemented with a dual-edge modulation scheme using dual ramps according to an exemplary embodiment. The FB pin is provided to the inverting (−) input of an error amplifier (E/A) 601, receiving a reference voltage VREF at its non-inverting (+) input provided by a reference circuit 603. The COMP pin is coupled to the output of the E/A 601, which is further coupled to the non-inverting (+) input of a first comparator 605 and to the inverting (−) input of another comparator 607. An FB pin develops an FB signal or voltage indicative of the voltage level of the output voltage VO. The E/A 601 amplifies the difference between FB and VREF and provides a corresponding COMP signal or voltage on the COMP pin. Thus, the COMP signal is indicative of the output voltage error, or the difference between the actual voltage level of VO and its reference voltage level as reflected by VREF. It may also be said that COMP is responsive to a transient load current change so that COMP is indicative of transient changes of the output load. The FS pin is coupled to an oscillator circuit 609, having a first output providing the down ramp signal DR to the inverting input of the comparator 605 and a second output providing the up ramp signal UR to the non-inverting input of the comparator 607. The output of comparator 605, generating a "set" signal CS, is provided to the set input S of an R-S flip-flop 611 and the output of comparator 607, generating a "reset" signal CR, is provided to the reset input R of the R-S flip-flop 611. The Q output of the R-S flip-flop 611 generates the PWM signal provided to (and by) the PWM pin of the controller 501. The R-S flip-flop 611 operates as pulse control logic to control the state of the PWM signal based on the outputs of the comparators 605 and 607. The PWM signal is internally fed back to the oscillator circuit 609.

Figure 3:
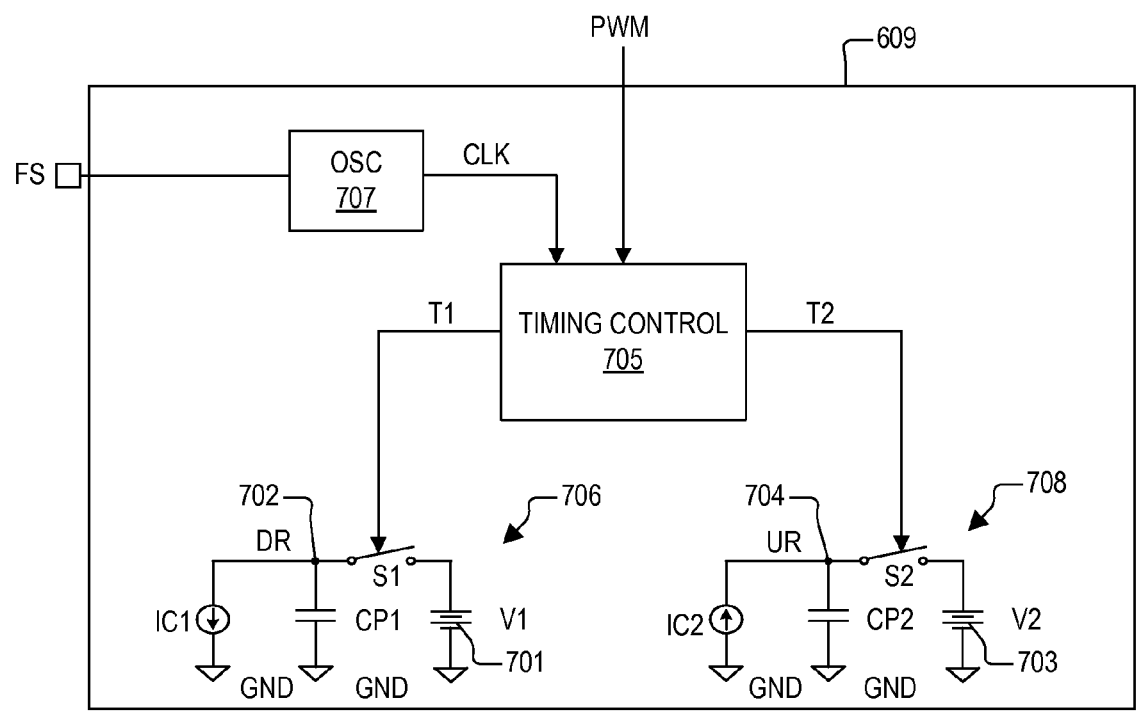
FIG. 3 is a simplified schematic and block diagram of an exemplary embodiment of the oscillator of FIG. 2.

FIG. 3 is a simplified schematic and block diagram of the oscillator circuit 609 according to an exemplary embodiment. The oscillator circuit 609 includes a first ramp circuit 706 for generating the down ramp signal DR and a second ramp circuit 708 for generating the up ramp signal UR. For the first ramp circuit 706, a voltage source 701 provides the V1 voltage to one terminal of a single-pole, single-throw (SPST) switch S1, having its other terminal coupled to a node 702 that develops the DR signal provided to the comparator 605. Node 702 is coupled to one end of a capacitor CP1 and to the input of a current sink IC1. The other end of the capacitor CP1 and the output of the current sink IC1 are each coupled to GND. For the second ramp circuit 708, another voltage source 703 provides the V2 voltage to one terminal of another SPST switch S2, having its other terminal coupled to a node 704 that develops the UR signal provided to the comparator 607. Node 704 is coupled to one end of a capacitor CP2 and to the input of a current source IC2. The other end of the capacitor CP2 and the input of the current source IC2 are each coupled to GND. A timing control circuit 705 generates a first timing signal T1 provided to a control input of the switch S1 and a second timing signal T2 provided to a control input of the switch S2. The CLK signal, which is generated by an oscillator 707, is provided to the timing control circuit 705 and has a frequency determined by the externally-coupled resistor RFS as previously described. The PWM signal is provided to the timing control circuit 705 for controlling timing of the DR and UR ramp signals. In an alternative embodiment, the CS and CR signals may be used instead of the PWM signal.

The timing control circuit 705 asserts the T1 signal high to close switch S1 to reset the DR signal to the V1 voltage level. The timing control circuit 705 asserts the T1 signal low to open the switch S1, so that the current sink IC1 discharges the capacitor CP1 to create the negative-going ramp of the DR signal. In one embodiment, the timing control circuit 705 keeps the T1 signal low until the next pulse of the CLK signal so that the DR signal continues to ramp down, similar to conventional leading edge modulation schemes, and then asserts the T1 signal high to close the switch S1 to reset DR back to the V1 voltage level to start the next CLK cycle. In an alternative embodiment, the timing control circuit 705 closes the switch S1 when the PWM signal goes high to reset the DR signal back to V1 earlier in the CLK cycle. If the DR signal resets prior to the next CLK pulse, then it is held until the next pulse of CLK.

The timing control circuit 705 asserts the T2 signal high to close switch S2 to reset the UR signal to the V2 voltage level. The timing control circuit 705 asserts the T2 signal low to open the switch S2, so that the current source IC2 charges the capacitor CP2 to create the positive-going ramp of the UR signal. The timing control circuit 705 controls the switch S2 via the T2 signal based on the PWM signal (or the CS and CR signals). When the PWM signal is low, the timing control circuit 705 closes the switch S2 via the T2 signal to keep the UR signal at V2. When the PWM signal is asserted high, the timing control circuit 705 opens the switch S2 via the T2 signal to allow IC2 to charge CP2 to generate the rising ramp of the UR signal.

Figure 8:
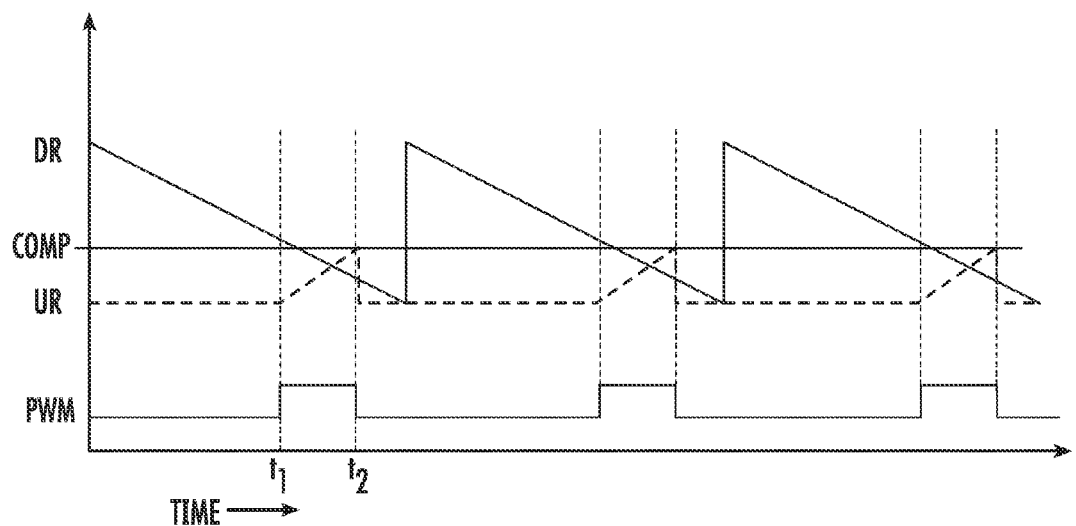
FIG. 8 is a simplified timing diagram generally illustrating operation of the dual-edge modulation scheme using dual ramps described for a single channel or for each channel of a multiphase converter.

Operation of the oscillator circuit 609, as controlled by the timing control circuit 705, is illustrated by the timing diagram of FIG. 8 and the block diagram of FIG. 2. When the DR signal falls to the voltage level of the COMP signal, the CS signal is asserted high to set the R-S flip-flop 611 which asserts the PWM signal high. The timing control circuit 705 opens the switch S2 to initiate the rising slope of the UR signal. When the UR signal rises to the voltage level of the COMP signal, the CR signal is asserted high to reset the R-S flip-flop 611 which pulls the PWM signal back low. The timing control circuit 705 closes the switch S2 to reset the UR signal back to V2. The comparison of the DR signal with the COMP signal triggers assertion of the PWM signal, which in turn triggers the rising slope of the UR signal. The UR signal determines the duration of the PWM signal, which is pulled back low when the UR signal rises to the level of the COMP signal.

The slew rate of the UR signal is proportional to any selected combination of the input voltage VIN, the voltage of the PH node, the voltage across the output inductor L, or the peak, average, or instantaneous current through the output inductor L. The VIN and/or PH voltages may be directly fed to the controller 501 or indirectly determined through various sensing means. Many techniques are known for sensing the current of the output inductor L.

Figure 4:
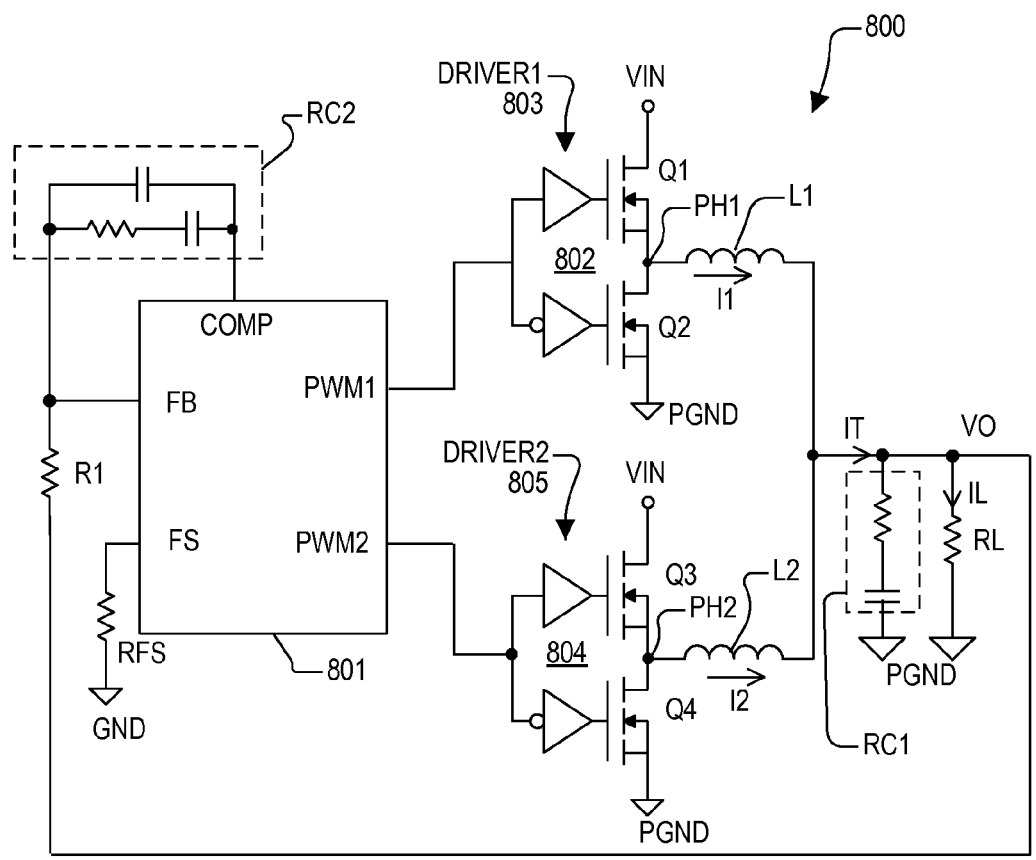
FIG. 4 is a block diagram of an exemplary DC-DC buck converter employing a two-phase voltage mode controller implemented according to an exemplary embodiment.

FIG. 4 is a block diagram of an exemplary DC-DC buck converter 800 employing a two-phase voltage mode controller 801 implemented according to an exemplary embodiment. The DC-DC buck converter 800 is similar to the DC-DC buck converter 500 in which similar components or devices assume identical reference numerals. The two-phase voltage mode controller 801 is similar to the single-phase voltage mode controller 501 and includes the FS, FB and COMP pins. The controller 801, however, includes first and second PWM pins PWM1 and PWM2 for controlling first and second phase circuits 802, 804 of the two-phase system. The PWM1 pin of the controller 801 is coupled to an input of a first driver circuit 803 (DRIVER1) of the first phase circuit 802, where the first driver circuit 803 drives the gates of electronic switches Q1 and Q2 (of the first phase circuit 802) having controlled current paths coupled between an input voltage VIN and PGND. The driver circuit 803 and the switches Q1 and Q2 are configured and coupled to operate in substantially the same manner as the driver circuit 503 and the switches Q1 and Q2 of the DC-DC buck converter 500. The PWM2 pin of the controller 801 is coupled to an input of a second driver circuit 805 (DRIVER2) of the second phase circuit 804, where the second driver circuit 805 drives the gates of electronic switches Q3 and Q4 (of the second phase circuit 804) having controlled current paths coupled between an input voltage VIN and PGND. The driver circuit 805 and the switches Q3 and Q4 are also configured and coupled to operate in substantially the same manner as the driver circuit 503 and the switches Q1 and Q2 of the DC-DC buck converter 500. For the DC-DC buck converter 800, however, the source of Q1 and the drain of Q2 are coupled together at a first phase node PH1 and coupled to one end of a first output inductor L1 (of the first phase circuit 802). Likewise, the source of Q3 and the drain of Q4 are coupled together at a second phase node PH2 and coupled to one end of a second output inductor L2 (of the second phase circuit 804). The other ends of the output inductors L1 and L2 are coupled together at an output node developing the output signal VO.

The remaining portion of the DC-DC buck converter 800 is substantially identical to the DC-DC buck converter 500. In particular, VO is coupled to a capacitor circuit RC1 which is coupled across the load resistor RL between VO and PGND. VO is fed back through a resistor R1 to the feedback pin FB of the controller 801. Another resistor-capacitor circuit RC2 is coupled between the FB pin and the compensation pin COMP of the controller 801. A frequency set resistor RFS is coupled between a frequency set pin FS of the controller 801 and GND. The frequency of the clock signal generally controlling the PWM cycles is programmable within a certain range as determined by the resistor RFS. As noted above, various other methods may be used for the frequency set function. The specific component values of RC1, RL, R1, RFS and RC2 may be modified as appropriate. As understood by those skilled in the art, each phase operates in substantially the same manner as described above for the DC-DC buck converter 500, except that the two phases are operated 180 degrees out of phase with respect to each other. The current through the output inductor L1 is shown as a first phase current I1, the current through the output inductor L2 is shown as a second phase current I2, and the total output current of both phases is shown as a total current IT flowing to the output node developing the VO signal. The current through the load resistor RL is shown as a load current IL.

Figure 5:
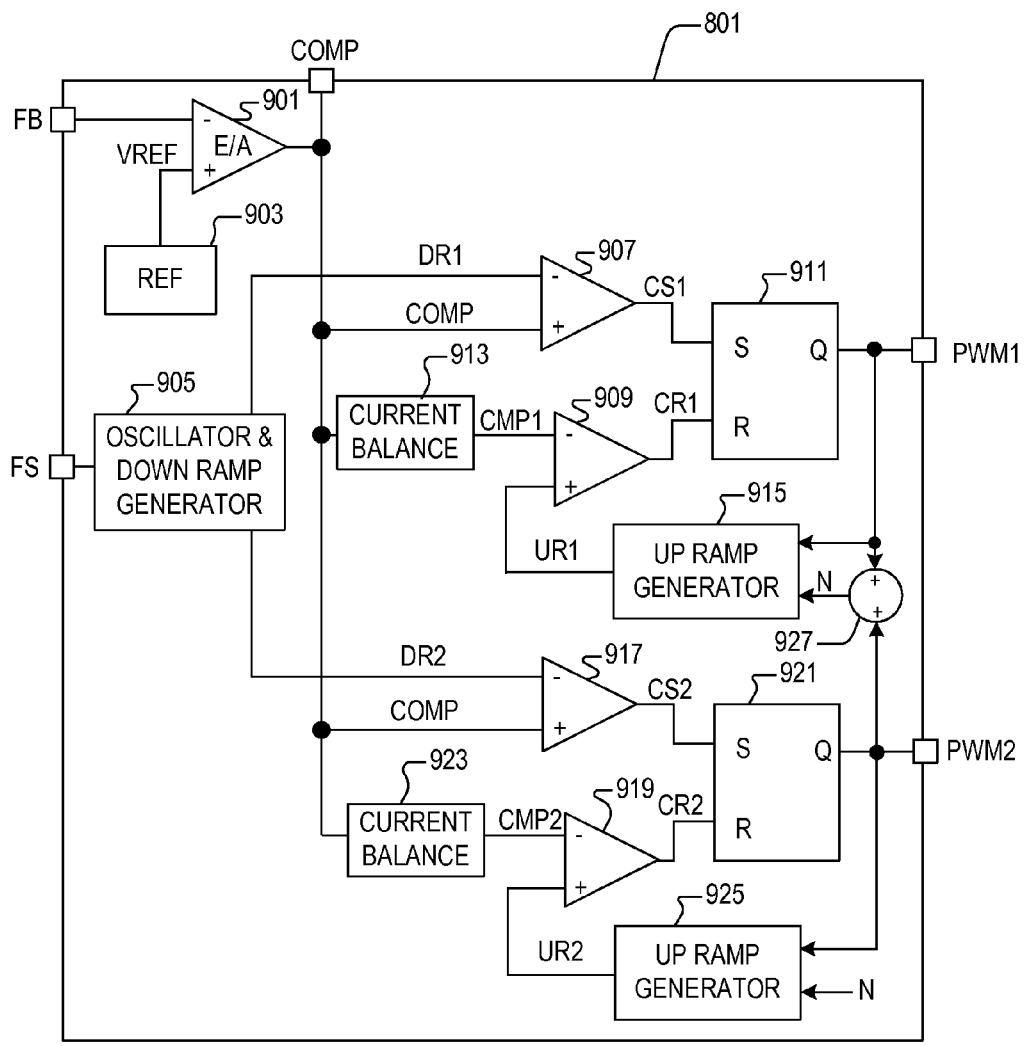
FIG. 5 is a simplified block diagram of an exemplary embodiment of the two-phase voltage mode controller of FIG. 4 implemented using dual ramp signals according to an exemplary embodiment.

FIG. 5 is a simplified block diagram of an exemplary embodiment of the two-phase voltage mode controller 801 implemented using dual ramp signals according to an exemplary embodiment. The FB pin is provided to the inverting input of an error amplifier (E/A) 901, receiving a reference voltage VREF at its non-inverting input provided by a reference circuit 903. The COMP pin is coupled to the output of the E/A 901 (providing the COMP signal), which is further coupled to the non-inverting inputs of a first comparator 907 and another comparator 917, and to the inputs of current balance circuits 913 and 923. The FS pin is coupled to an oscillator and down ramp generator circuit 905, having a first output providing a first down ramp signal DR1 to the inverting input of the comparator 907 and a second output providing a second down ramp signal DR2 to the inverting input of the comparator 917. The output of the current balance circuit 913 provides a first adjusted compensation signal CMP1 which is provided to the inverting input of another comparator 909. The output of the current balance circuit 923 provides a second adjusted compensation signal CMP2 which is provided to the inverting input of another comparator 919. The output of comparator 907, generating a first set or "start" signal CS1, is provided to the set input S of a first R-S flip-flop 911. The output of comparator 909, generating a first reset or "stop" signal CR1, is provided to the reset input R of the R-S flip-flop 911. The output of comparator 917, generating a second set or start signal CS2, is provided to the set input S of a second R-S flip-flop 921. The output of comparator 919, generating a second reset or stop signal CR2, is provided to the reset input R of the R-S flip-flop 921.

The Q output of the R-S flip-flop 911 generates the PWM1 signal provided to (and by) the PWM1 pin of the controller 801, and the Q output of the R-S flip-flop 921 generates the PWM2 signal provided to (and by) the PWM2 pin of the controller 801. The PWM1 and PWM2 signals are provided to respective inputs of a pulse adder 927, having an output providing a phase number or pulse count signal "N" to a first input of a first up ramp generator 915, having a second input receiving the PWM1 signal. The up ramp generator 915 has an output coupled to the non-inverting input of the comparator 909 for providing a first up ramp signal UR1. The N signal and the PWM2 signal are provided to respective inputs of a second up ramp generator 925, having an output coupled to the non-inverting input of the comparator 919 for providing a second up ramp signal UR2. In the embodiment illustrated, N is an integer number determining the total number of PWM signals that are turned on at the same time (or representing the total number of active phases). Thus, the pulse adder 927 outputs N=0 when PWM1 and PWM2 are both low, N=1 when either one but not both of the PWM1 and PWM2 signals is high, and N=2 when both of the PWM1 and PWM2 signals are high.

The current balance circuits 913 and 923 collectively form a current balance system in which each operates to adjust the COMP signal based on the total current IT of both phases and the corresponding phase current of the respective phase I1 or I2. In one embodiment, the output of the current balance circuit 913 is CMP1=COMP+k*(I2−I1) for phase 1, where "k" is a constant gain factor, I1 is the current of phase 1 (through output inductor L1), and the asterisk "*" denotes multiplication. Likewise, the output of the current balance circuit 923 is CMP2=COMP+k*(I1−I2) for phase 2, where I2 is the current of phase 2 (through output inductor L2). The respective current signals may be sensed using any of a number of methods known to those skilled in the art. In this embodiment, when I1 and I2 are equal to each other, the current balance circuits 913 and 923 have no impact on the operation. It is noted that offsetting COMP in this manner is only one of many methods of inserting balance feedback. Another method, for example, is adjustment of the slopes of the up ramp signals, which provides a more constant balance gain as the input to output voltage ratio changes.

Figure 6:
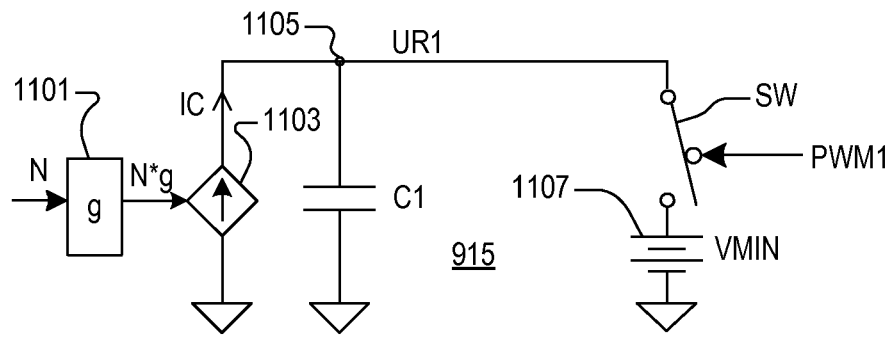
FIG. 6 is a simplified block diagram of the up ramp generator of FIG. 9 according to an exemplary embodiment.

FIG. 6 is a simplified block diagram of the up ramp generator 915 according to an exemplary embodiment. The up ramp generator 925 is configured in substantially the same manner and is not further described. The N signal is provided to a gain circuit 1101 which multiplies N by a gain factor "g" and outputs the value N*g to a control input of a controlled current source 1103. The current source 1103 has an input coupled to GND and an output coupled to a node 1105 developing the up ramp signal UR1. Node 1105 is coupled to one end of a capacitor C1 and to one terminal of a SPST switch SW. The other end of the capacitor C1 is coupled to GND and the second terminal of the switch SW is coupled to the positive terminal of a voltage source 1107 developing the VMIN voltage. The negative terminal of the voltage source 1107 is coupled to GND. The switch SW has an inverted control terminal receiving the PWM1 signal.

In operation, when the PWM1 signal is low, the switch SW is closed and the UR1 signal is pulled down to the voltage level VMIN. Recall in FIG. 6 that when the PWM1 signal is low, the UR1 signal is reset back to VMIN. When the PWM1 signal is pulled high, it opens the switch SW, so that the current source 1103 generates a charge current IC to charge the capacitor C1. While the switch SW is opened, the voltage of UR1 increases based on the magnitude of IC. The magnitude of IC is a predetermined nominal value multiplied by the factor N*g. For N=1, the slew rate of UR1 is m1 and when N=2, the slew rate of UR1 is m2 as previously described. In the embodiment illustrated, m2 is twice that of m1. Although not shown, another, higher voltage supply may be included and coupled to the node 1105 via a diode or the like to limit the voltage level of UR1 to a predetermined maximum level.

The current balance circuits 913 and 923 operate to divide the load current as evenly as practical amongst the phases. The current balance circuits receive signals that represent the current in each phase and appropriately filters and otherwise processes the input signals to generate current balance signals which are proportional to the deviation of the current in each phase from the average current of all phases. These current balance signals are combined as an offset term in the calculation of the difference between a fixed reference and the COMP signal used to determine the duration of the time intervals for each respective phase. The effect of the current balance circuits is to drive all phase currents toward each other in a closed loop method. Because of the closed loop nature of the circuit, provided that all phases are treated equally, the offsets can be handled in a bipolar manner or can be truncated or offset to produce strictly a positive or a negative offset.

Figure 7:
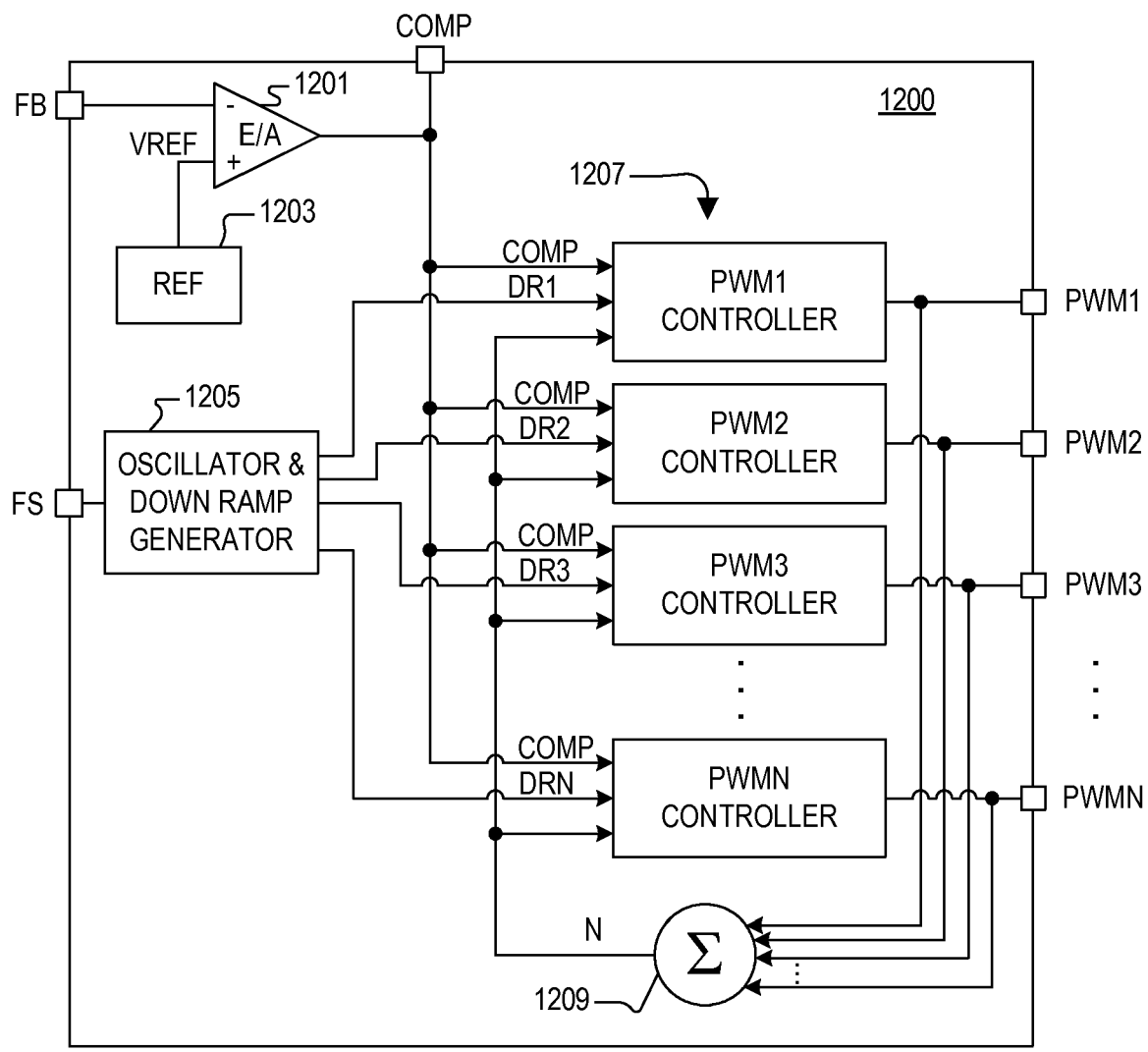
FIG. 7 is a simplified block diagram of an exemplary embodiment of an N-phase voltage mode controller implemented using dual ramp signals according to an exemplary embodiment.

FIG. 7 is a simplified block diagram of an exemplary embodiment of an N-phase voltage mode controller 1200 implemented using dual ramp signals according to an exemplary embodiment. The N-phase voltage mode controller 1200 is similar in configuration and operation to the two-phase voltage mode controller 801 except generalized to control up to "N" phases in which N is any positive integer greater than 0 (and can be used to control a single phase if desired). The controller 1200 includes the FS, FB and COMP pins in a similar manner as the controller 801. The controller 1200 includes an E/A 1201 (similar to the E/A 901) having its inverting input coupled to the FB pin and its non-inverting input receiving a reference voltage VREF. VREF is provided by a reference circuit 1203 (similar to the reference circuit 903). The output of E/A 1201 provides the COMP signal which is further provided to the COMP pin and to each of N PWM controllers 1207, individually labeled PWM1 controller, PWM2 controller, PWM3 controller, . . . , PWMN controller. The PWM controllers 1207 each have an output providing a corresponding one of N PWM signals PWM1-PWMN provided to corresponding pins PWM1-PWMN. The PWM1-PWMN signals are also provided to respective inputs of a pulse adder 1209, having an output providing the N phase number signal to each of the PWM controllers 1207. The pulse adder 1209 operates in a similar manner as the pulse adder 927 except adding up to N simultaneously active PWM pulses. The oscillator and down ramp generator circuit 905 is replaced with a similar oscillator and down ramp generator circuit 1205 having an input coupled to the FS pin and N outputs providing corresponding down ramp signals DR1, DR2, DR3, . . . , DRN, where each down ramp signal DR1-DRN is provided to a corresponding one of the N PWM controllers 1207.

The generator circuit 1205 operates in a similar manner as the generator circuit 905 except that it separates the down ramp signals by the appropriate nominal phase angles depending upon the number of active or selected phases in operation. For example, for two phases the two down ramp signals DR1 and DR2 are separated by 180 degrees (e.g., 0, 180), for four phases the four down ramp signals DR1, DR2, DR3 and DR4 are separated by 90 degrees (e.g., 0, 90, 180, 270), for six phases the six down ramp signals DR1-DR6 are separated by 60 degrees (e.g., 0, 60, 120, 180, 240, 320), and so on. Each PWM controller 1207 includes a current balance circuit (e.g., similar to 913) receiving the COMP signal and providing a corresponding modified compensation signal, an up ramp generator (e.g., similar to 915) having inputs receiving the N phase number signal and a corresponding PWM signal and an output providing a corresponding up ramp signal, a first comparator (e.g., similar to 907) comparing a corresponding down ramp signal with the COMP signal and providing a set signal, a second comparator (e.g., similar to 909) comparing the corresponding modified compensation signal with the corresponding up ramp signal and providing a reset signal, and PWM logic (e.g., similar to R-S flip-flop 911) receiving the set and reset signals and providing the corresponding PWM signal. The slew rate of each up ramp signal of each phase is adjusted by the total number of PWM pulse signals that are high at the same time as determined by the N phase number signal provided by the pulse adder 1209.

FIG. 8 is a simplified timing diagram generally illustrating operation of the dual-edge modulation scheme using dual ramps described for a single channel or for each channel of a multiphase converter. An exemplary COMP signal is plotted with an exemplary down ramp signal DR and an exemplary up ramp signal UR and a PWM signal versus time. The COMP signal is simplified and shown as a non-varying horizontal line signal, where it is understood that the COMP signal normally varies based on operating conditions, such as with output voltage, load current, etc. DR repeatedly ramps down with constant slope from a maximum level to a minimum level and then resets back to the maximum level at a predetermined fixed frequency. Each time the DR signal falls below COMP, such as shown at time t1, the UR signal is initiated and begins ramping up from its minimum value and a pulse is initiated on the PWM signal. When the UR signal rises above COMP, such as shown at time t2, the PWM pulse is terminated and the UR signal is reset back to its minimum value.

The dual-edge modulation scheme with dual ramps heretofore described as several benefits, particularly with respect to conventional leading edge or trailing edge schemes. Each leading and trailing edge of each of the PWM pulses responds to load changes. For example, if COMP rises in response to increasing load (e.g., decrease in output voltage), it intersects DR sooner in the cycle thereby moving the PWM pulse ahead in time. Similarly, when COMP is higher, the up ramp UR ramps up higher and longer before reaching COMP so that the PWM pulse is wider since it stays active longer. In response to decreased COMP, the PWM pulses tend to move to later in time per cycle and may become shorter in duration. The dual-edge modulation scheme with dual ramps is also referred to as an active pulse positioning (APP) scheme in which PWM pulses are repositioned and re-sized based on operating conditions, such as output voltage, load current, etc.

Figure 9:
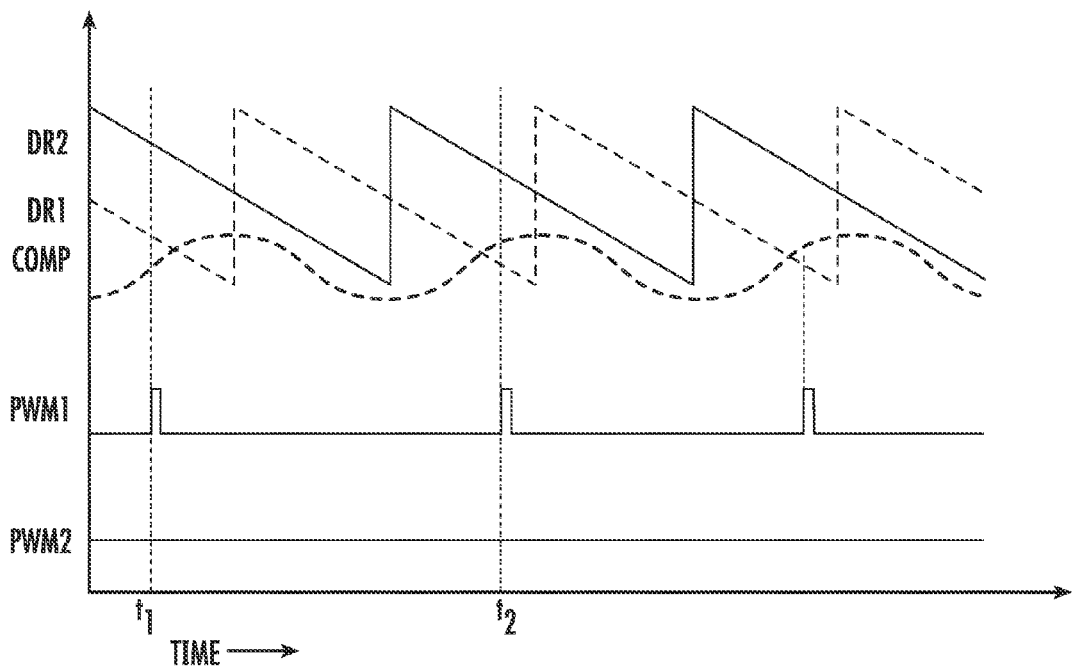
FIG. 9 is a timing diagram plotting a two channel scheme including a down ramp DR1 and a PWM1 signal for a first channel and a down ramp DR2 and a PWM2 signal for a second channel.

Each down ramp signal per channel has a fixed frequency. In this manner, load transients that are at or near the set PWM frequency or harmonies thereof can cause high current imbalance between the channels. FIG. 9 is a timing diagram plotting a two channel scheme including a down ramp DR1 and a PWM1 signal for a first channel and a down ramp DR2 and a PWM2 signal for a second channel, and a COMP signal shown as a dotted line. DR1 is shown as a solid line whereas DR2 is shown as a dashed line and both are superimposed on top of each other along with the COMP signal. The up ramp signals are not shown but operate in a similar manner per channel as shown in FIG. 8. COMP is shown oscillating at or near the frequency of each down ramp signal. The repetitive waveform on the COMP signal keeps missing the peak of DR2 for each cycle so that PWM pulses only occur on the PWM1 signal as illustrated in FIG. 9, resulting in a current imbalance between the channels. Thus, pulses occur only on the first phase whereas no pulses occur on the second phase, and the phases are activated out or order for one or more cycles. In one modified dual pulse scheme, pulses are inserted when the modulator misses pulses to counteract this imbalance. The insertion of pulses in this manner may lead to chaotic behavior within the modulator, such as when the channels "fire" out of sequence. It is desirable to maintain a strict firing order in a multiphase regulator system.

Figure 10:
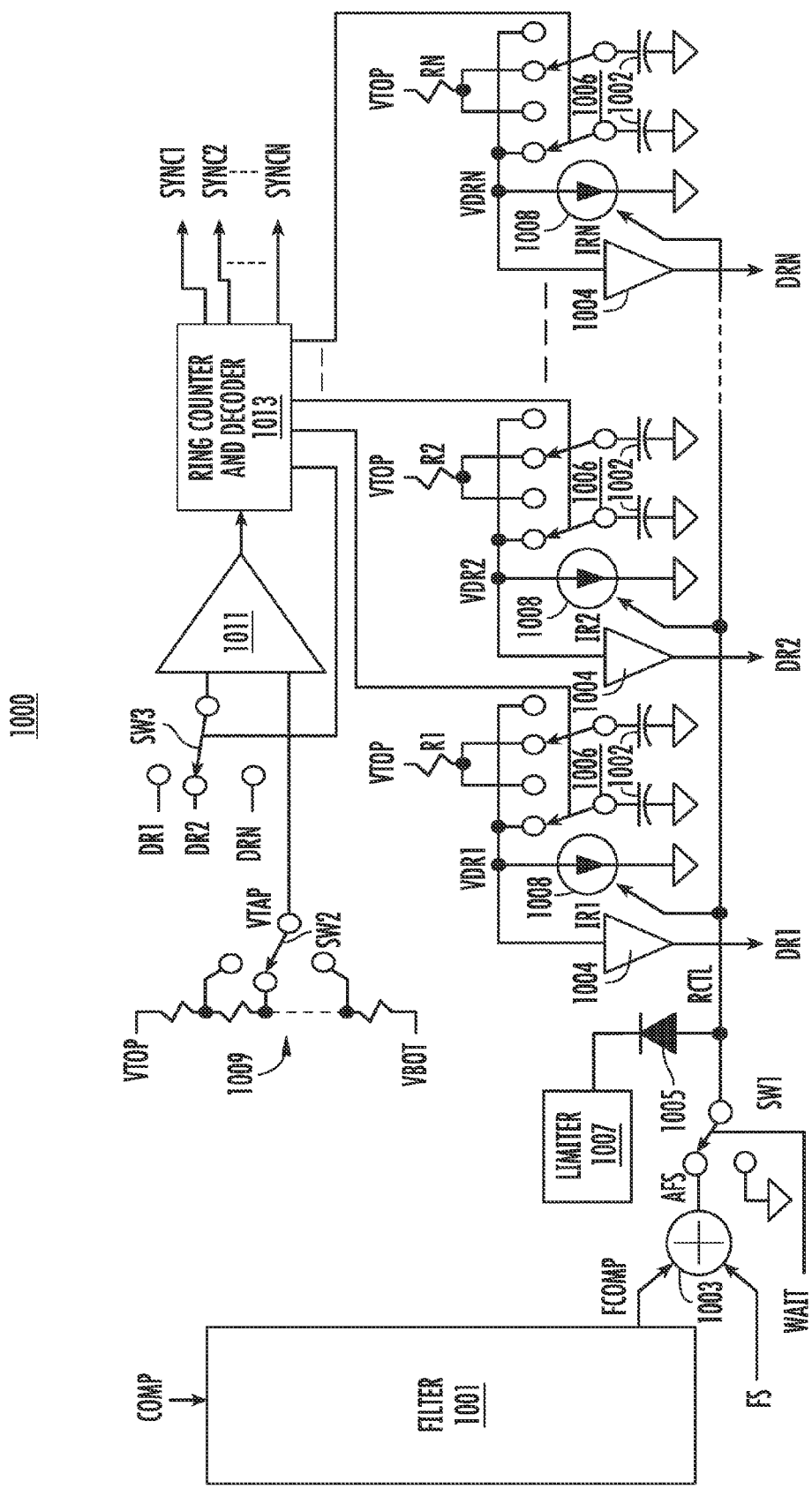
FIG. 10 is a schematic and block diagram of a down ramp generator implemented according to an exemplary embodiment for an exemplary multiphase adaptive pulse positioning (APP) system.

FIG. 10 is a schematic and block diagram of a down ramp generator 1000 implemented according to an exemplary embodiment for an exemplary multiphase adaptive pulse positioning (APP) system. The down ramp generator 1000 generates down ramps as the leading edge ramp signals, where it is understood that positive-going or up ramps may be used instead as the leading edge ramp signals in alternative configurations. The COMP signal is provided to an input of a filter circuit 1001, having an output providing a filtered compensation signal FCOMP to one input of a combiner 1003, such as an adder or the like. A frequency set signal FS is provided to another input of the combiner 1003, which has an output developing an adjusted FS signal AFS. AFS is provided to a first switched pole of a switch SW1. The FS signal is provided on the FS pin or any other node providing frequency set information. The switch SW1 is shown as a single-pole, double-throw (SPDT) switch having a common pole coupled to a ramp control node RCTL developing a ramp control signal RCTL. The other switched pole of SW1 is coupled to ground and is controlled by a signal WAIT. A limiter diode 1005 has its anode coupled to node RCTL and its cathode coupled to a limiter circuit 1007. The limiter circuit 1007 limits the maximum voltage of RCTL such that when RCTL rises to the maximum voltage forward biasing the limiter diode 1005, the limiter circuit 1007 clamps the voltage of RCTL to the maximum voltage. The RCTL node is coupled to the current control input of each of a set of N current sinks 1008, in which "N" is an integer greater than zero (0) which determines the number of channels or phases of the APP system. Each current sink 1008 is coupled between a corresponding one of N down ramp nodes VDR1, . . . , VDRN and ground and sinks a corresponding one of N currents IR1, . . . , IRN as controlled by RCTL for the N channels. Each channel includes at least one capacitor 1002 coupled between ground and at least one pole of a reset switch 1006, which selectively couples the other end of the capacitor 1002 to a corresponding one of the down ramp nodes VDR1-VDRN and another node coupled via a corresponding one of N resistors R1-RN to an upper ramp voltage VTOP. The resistors R1-RN limit inrush current when charging the corresponding capacitors. Each down ramp node VDR1-VDRN is coupled to an input of a corresponding one of N output buffers 1004, each having an output providing a corresponding one of N down ramp signals DR1, . . . , DRN.

A resistor ladder 1009 includes a set of series-coupled resistors with intermediate nodes having one end coupled to the upper ramp voltage VTOP and another end coupled to a lower ramp voltage VBOT. A switch SW2 selects one of the intermediate junctions of the resistor ladder 1009 to provide a tap voltage VTAP to one input of a comparator 1011. In one embodiment, VTAP is selected such that (VTOP−VTAP)= (VTOP−VBOT)/N to synchronize the down ramp signals as further described below. VTAP is thus selected to be (N−1) (VTOP−VBOT)/N which is 1/Nth of the full ramp voltage swing VTOP-VBOT from the upper voltage VTOP. Another switch SW3 selects one of the down ramp signals DR1-DRN for coupling to the other input of the comparator 1011, which has an output coupled to an input of a ring counter and decoder circuit 1013. The ring counter and decoder circuit 1013 has an output coupled to a control input of the switch SW3 for selecting one of the down ramp signals DR1-DRN. The ring counter and decoder circuit 1013 has another set of outputs coupled to the control inputs of the reset switches 1006. The ring counter and decoder circuit 1013 has another set of outputs providing synchronization pulses on corresponding N synchronization nodes SYNC1-SYNCN. Each channel may include one capacitor 1002 which is switched by a corresponding reset switch 1006 between VTOP and a corresponding down ramp node VDRx, in which "x" appended at the end of a signal name represents an index value between 1 and N, inclusive, denoting a corresponding channel in an N-channel system. In an alternative embodiment to speed up reset, as shown, each channel includes two capacitors 1002 and each reset switch 1006 is configured as a double-pole, double-throw (DPDT) switch which alternatively couples one channel capacitor to VTOP and the other to corresponding node VDRx. In this manner, while one channel capacitor is charged to VTOP, the other is discharged by a corresponding current sink 1008 decreasing VDRx for developing a corresponding ramp voltage DRx.

In operation, FS is selected to correspond to a nominal frequency level FNOM which is adjusted by FCOMP. Each of the current sinks 1008 are controlled by the same signal RCTL so that each of the ramp voltages DRx ramp down at the same rate at any given time. The rate of decrease, or the slope, of the ramp signals is controlled by RCTL. Assuming first that FCOMP is zero, RCTL is set at FS so that each of the ramp signals DRx oscillate at FNOM. The ring counter and decoder circuit 1013 advances to the next channel, such as channel 1, controls the switch SW3 to advance to the corresponding ramp voltage, DR1, switches the corresponding reset switch 1006 for channel 1, and asserts a corresponding pulse on SYNC1. When switched, the capacitor 1002, which is charged to VTOP, is coupled to VDR1, and is discharged by the corresponding current sink 1008. Thus, VDR1 starts at VTOP and begins decreasing and the corresponding ramp signal DR1 ramps down from VTOP towards VBOT. When DR1 decreases to VTAP, which is 1/Nth of the way down from VTOP to VBOT, the comparator 1011 switches and the ring counter and decoder circuit 1013 switches to the next channel 2 and asserts a pulse on SYNC2. While DR1 continues ramping down, DR2 is reset back to VTOP and begins ramping down towards VBOT. When DR2 decreases to VTAP, the comparator 1011 switches again and the ring counter and decoder circuit 1013 switches to the next channel 3 (assuming at least 3 channels) and a pulse is asserted on SYNC3. At this time, DR1 has dropped to 2/Nths of the way down from VTOP, DR2 has dropped to 1/Nth down, and DR3 is reset back to VTOP. While DR1 and DR2 continue ramping down, DR3 is reset back to VTOP and begins ramping down towards VBOT. Operation continues in this manner to the Nth channel, and operation wraps back to the first channel in round-robin fashion.

Assuming only 3 channels, DR1 has dropped ⅔rds down and DR2 has dropped ⅓rd down when DR3 is reset back to VTOP. When DR3 drops ⅓ of the way from VTOP to VBOT, DR2 has dropped ⅔rds and DR1 has dropped to 3/3rds or all the way to VBOT and is reset back to VTOP. Operation continues in a round-robin fashion between the 3 channels. In general, the down ramp generator 1000 resets N down ramp signals (or any appropriate leading edge ramp signal) in round-robin order so that the N ramp signals are separated from each other by 1/Nth of the voltage range VTOP−VBOT. As a specific example, suppose VTOP=3V, VBOT=2V and N=4 for a four channel system. Thus, the voltage range between VTOP and VBOT is 1V and 1/Nth of this voltage range is 0.25V. When a first ramp 1 resets back to 3V, a second ramp 2 is at 2.75V, a third ramp 3 is at 2.5V, and a fourth ramp 4 is 2.25V. When the first ramp 1 drops to 2.75V, ramp 2 has dropped to 2.5V, ramp 3 has dropped to 2.25V, and ramp 4 drops to 2.0V and then is reset back to 3V.

Under steady state operating conditions, operation of the down ramp generator 1000 is substantially similar to the down ramp generator used in the dual-edge modulation scheme using dual ramps previously described. In non-steady state conditions, however, the filter circuit 1001 responds to changes of COMP and adjusts FCOMP accordingly. In an alternative embodiment, the output voltage may be monitored instead, or a combination of COMP and the output voltage VO. In one embodiment, FCOMP increases RCTL up to a maximum level or decreases RCTL down to a minimum level, and the slope of each of the ramp voltages DR1-DRN is adjusted accordingly. In one embodiment, the slopes may be decreased to zero; in another embodiment, the slopes may decrease to a predetermined minimum slope value greater than zero. In one embodiment, the predetermined minimum slope value corresponds to the target frequency level of operation. When the slopes of the ramp voltages DR1-DRN are increased so that they ramp down at a faster rate, the frequency of modulator increases. Likewise, when the slopes of the ramp voltages DR1-DRN are decreased so that they ramp down at a slower rate, the frequency of modulator decreases. For example, an increase in load current causes a drop of the output voltage VO and a corresponding increase of the COMP signal. FCOMP increases so that the combiner 1003 increases RCTL above FS so that the slope of each of the ramp voltages DR1-DRN increases by a corresponding amount. The increase of the down ramp slopes increases the operating frequency of the down ramp generator 1000. In this manner, the frequency of operation increases with increased load to more quickly respond to the increase of the load. The limiter circuit 1007 clamps RCTL to a maximum level corresponding to a maximum frequency of operation FMAX. In one embodiment, FMAX corresponds to 3/2 of FNOM established by FS.

In one embodiment, the filter circuit 1001 includes a bandpass filter (not shown) to both filter out noise and set the AC response of the current sinks 1008. In this manner, the down ramps change due to the delta or change of load current rather than the steady state load current. The filter circuit 1001 may also include a deadband filter (not shown) so that small values of change, such as normal output ripple, do not affect the down ramp voltages. In one embodiment, the bandpass filter is implemented with a high pass filter (HPF) (not shown) and a separate low pass filter (LPF) (not shown) to collectively filter out undesired frequencies, along with the separate deadband filter. In one embodiment, the HPF is set at TSW/20 (in which TSW is 1/FNOM) and the LPF is set to TSW/1000. In one embodiment, the filter circuit 1001 allows FCOMP to be positive or negative so that RCTL is either increased or decreased to increase or decrease the down ramp voltages DR1-DRN during operation. In one embodiment, the slope of each of the down ramp voltages DR1-DRN increases or decreases but is not allowed to drop below the level established by FS, so that the frequency at any given time is at or above FNOM. An exception to this is a WAIT function which forces each of the down ramps to at or near zero, as further described below.

As described further below, each channel includes circuitry which monitors a corresponding one of the SYNCx signals to maintain PWM pulse order for each of the N channels. The SYNCx signal for a given channel arms that channel for the current cycle and a PWM pulse occurring during the cycle resets the channel. If a second SYNCx pulse is received for a channel before that channel is reset, meaning that a PWM pulse did not occur during the entire PWM cycle for that channel, then that channel asserts the WAIT signal to initiated the WAIT mode in which all of the down ramps are temporarily paused. When WAIT is asserted, SW1 grounds RCTL to turn off the current sinks 1008 for each of the N channels (or at least set them all to a relatively low level). This effectively suspends the ramp voltages to hold their corresponding voltage levels (slope of the ramp voltages DR1-DRN go to zero or near zero) until WAIT is de-asserted. In one embodiment, the WAIT outputs of the channels are wired-OR'd together so that any channel that misses a pulse simultaneously pauses all of the N channels. When the compensation signal rises to a predetermined minimum voltage level, such as VBOT, a pulse is asserted on the channel that initiated the WAIT mode and WAIT is de-asserted low. When WAIT is de-asserted low, operation resumes and PWM pulse order is maintained.

Figure 11:
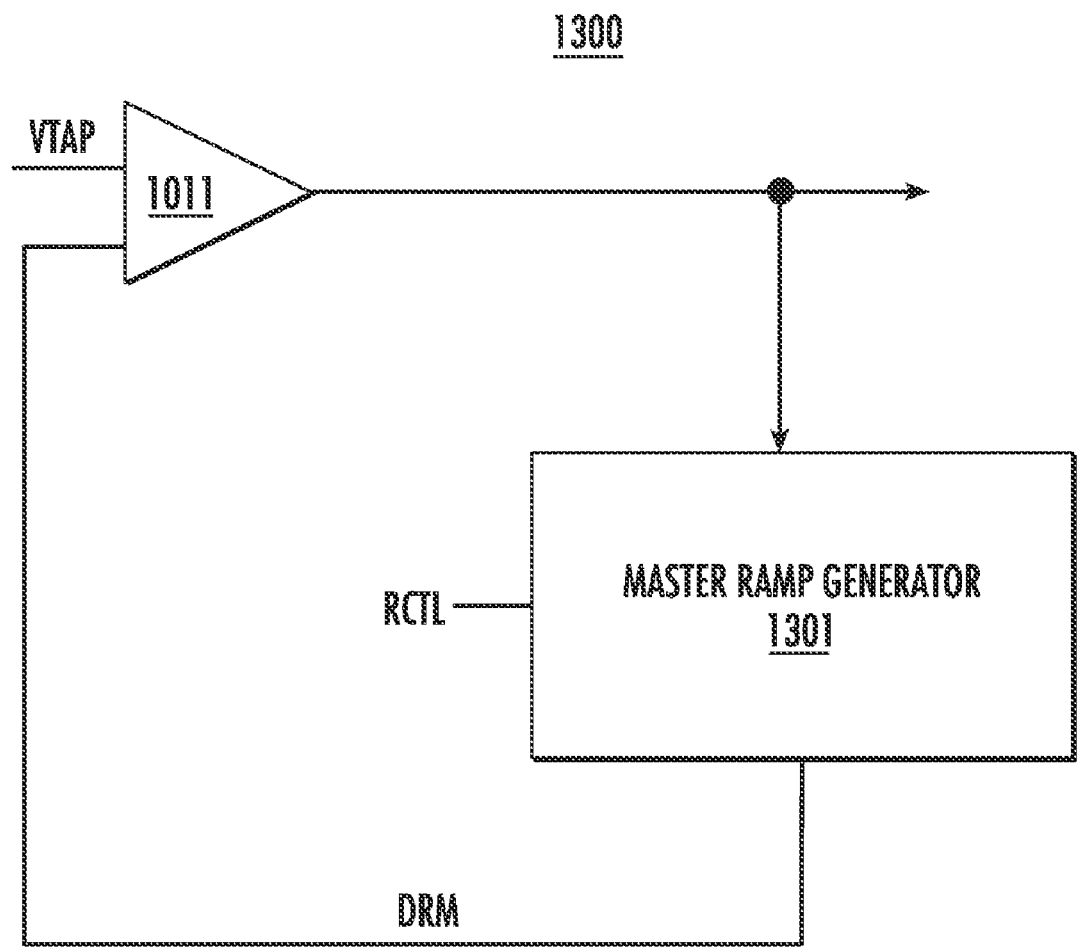
FIG. 11 is a simplified schematic and block diagram of a ramp timing generator according to an alternative embodiment of the down ramp generator of FIG. 10 using a master ramp generator.

FIG. 11 is a simplified schematic and block diagram of a ramp timing generator 1300 according to an alternative embodiment of the down ramp generator 1000 using a master ramp generator 1301. The comparator 1011 has one input coupled to VTAP in the same manner but has its other input receiving a master ramp voltage DRM from the master ramp generator 1301. Thus, the switch SW3 is eliminated so that timing is controlled instead by the master ramp generator 1301 rather than the actual ramp voltages DR1-DRN. The master ramp generator 1301 is configured in substantially the same manner as the channel ramp generators (including a corresponding current sink 1008, one or more channel capacitors 1002, a reset switch 1006, etc.) and is controlled by the RCTL voltage. The output of the comparator 1011 is coupled to control the reset switch 1006 of the master ramp generator 1301. Operation of the down ramp generator 1000 using the master ramp generator 1301 is substantially the same. When DRM drops to VTAP, which is 1/Nth (VTOP−VBOT) from VTOP as before, the comparator 1011 switches and resets the master ramp generator 1301 back to VTOP. In this manner, the master ramp generator 1301 operates at a higher frequency in which DRM ramps down to VTOP−(VTOP−VBOT)/N and then resets back to VTOP for each cycle. An advantage of the ramp timing generator 1300 is that the input of the comparator 1011 is not coupled to the actual ramp voltages DR1-DRN avoiding glitches or voltage anomalies on the ramp voltages DR1-DRN caused by switching of the comparator 1011. DRM ramps from VTOP down to VTOP−1/N(VTOP−VBOT) and resets back to VTOP each cycle, whereas the regular ramp voltages DR1-DRN operate in the same manner previously described.

Figure 12:
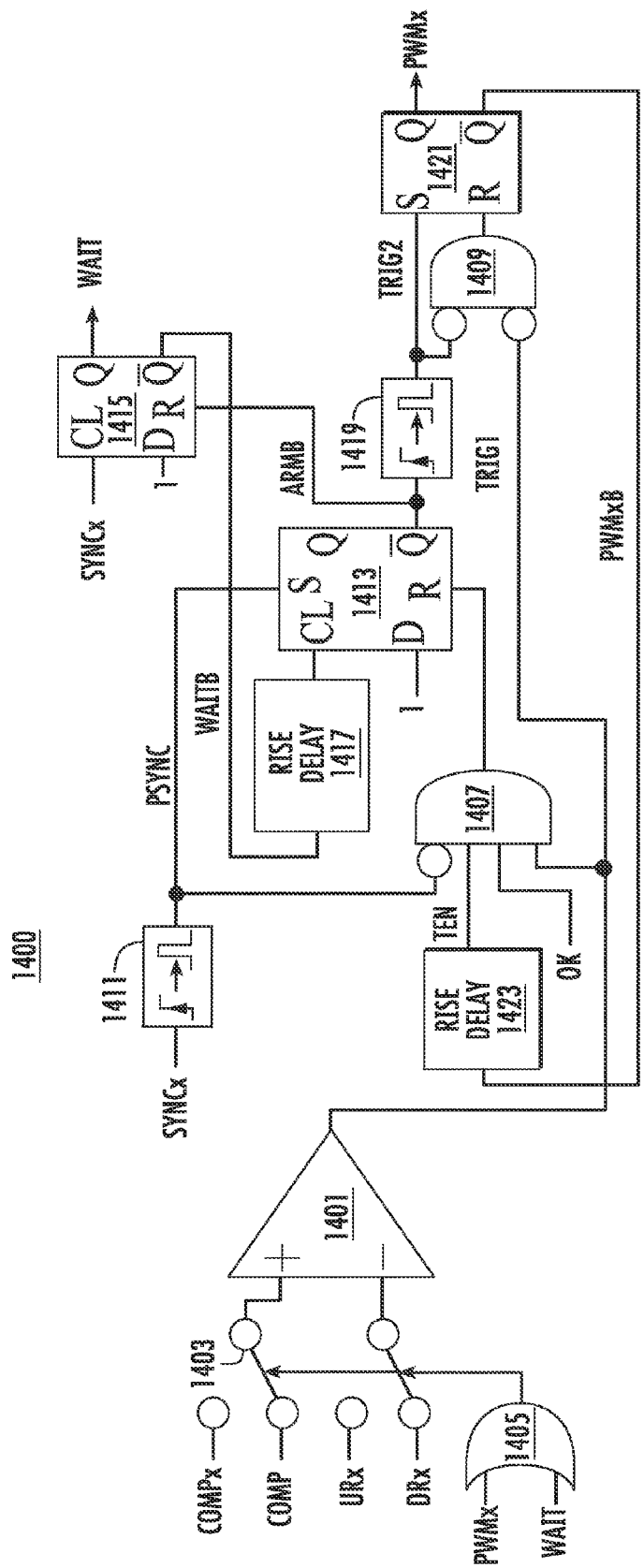
FIG. 12 is a simplified block diagram of an exemplary embodiment of a voltage mode APP controller implemented according to an APP scheme according to an exemplary embodiment.

FIG. 12 is a simplified block diagram of an exemplary embodiment of a voltage mode APP controller 1400 implemented according to an APP scheme according to an exemplary embodiment. The APP controller 1400 may be used for a single-phase scheme or for each channel of a multiphase regulator system. A comparator 1401 has inputs coupled to the common poles of a DPDT switch 1403 similar to the DPDT 1006 previously described. A first pair of switched poles of the DPDT switch 1403 receive the COMP signal and a down ramp signal DRx, and a second pair of switched poles of the DPDT switch 1403 receive an adjusted compensation signal CMPx and an up ramp signal URx. As previously noted, "x" appended at the end of a signal name represents an index value between 1 and N, inclusive, denoting any one of the channels in an N-channel system. The appended "x" notation may be ignored for a single-phase or single-channel system. The CMPx signal is an adjusted version of the COMP signal in a similar manner as the CMP1 and CMP2 signals at the outputs of the current balance circuits 913 and 923, respectively. In one embodiment, COMP is modified by average output current for ringback reduction and offset for direct current mode (DCM) of operation. URx is a corresponding up ramp signal for the channel. A two-input OR gate 1405 has a first input receiving a signal PWMx, a second input receiving the WAIT signal, and an output provided to the control input of the DPDT switch 1403. When PWMx and WAIT are both low, the output of the OR gate 1405 is low so that the switch 1403 selects and provides the COMP and DRx signals to the non-inverting and inverting inputs, respectively, of the comparator 1401. When either one (or both) of the PWMx and WAIT signals is (are) high, the output of the OR gate 1405 is high so that the switch 1403 selects and provides the CMPx and URx signals to the non-inverting and inverting inputs, respectively, of the comparator 1401.

The output of the comparator 1401 provides a first trigger signal TRIG1 to one input of a 4-input AND gate 1407 and to one inverted input of a 2-input AND gate 1409 with inverted inputs. A SYNCx signal is provided to the input of a pulse generator 1411, having an output providing a pulse signal PSYNC to an inverted input of the AND gate 1407 and to the set input of a D-type flip-flop (DFF) 1413. The pulse generator 1411 asserts a momentary high pulse on the PSYNC signal for each rising edge of SYNCx. The SYNCx signal is also provided to the clock input of another DFF 1415, which receives a logic one ("1") at its D input and which provides the WAIT signal at its Q output. The inverted Q output ($\overline{Q}$) of the DFF 1415 outputs an inverted wait signal WAITB, which is provided to the input of a delay block 1417. The output of the delay block 1417 is coupled to the clock input of the DFF 1413. In one embodiment, the delay block 1417 inserts a delay for every rising edge of WAITB. The inverted Q output of the DFF 1413 develops an ARMB signal, which is provided to a reset input of the DFF 1415 and to the input of a pulse generator 1419. The output of the pulse generator 1419 provides another trigger signal TRIG2 to the set input of an R-S flip-flop (RSFF) 1421 and to the other inverted input of the AND gate 1409. The pulse generator 1419 operates in a similar manner as the pulse generator 1411 in which it asserts a momentary high pulse on the TRIG2 signal for each rising edge of ARMB. The output of the AND gate 1409 is provided to the reset input of the RSFF 1421, and the Q output of the RSFF 1421 provides the PWMx signal. The inverted Q output of the RSFF 1421 provides an inverted PWMx signal, or PWMxB, which is provided to the input of a delay block 1423. The output of the delay block 1423 develops a trigger enable signal TEN, which is provided to another input of the AND gate 1407. In one embodiment, the delay block 1423 inserts a delay for every rising edge of PWMxB before asserting TEN. The output of the AND gate 1407 is provided to the reset input of the DFF 1413. The D input of the DFF 1413 receives a logic one. A signal OK is provided to another input of the AND gate 1407, in which OK indicates that the adjusted compensation signal is greater than the corresponding up ramp signal indicating that it is ok to start a pulse on the PWM signal. The OK signal is common to all channels in a multiphase regulator system.

The down ramp generator 1000 generates a down ramp signal for each channel including DRx, and a separate up ramp generator generates each up ramp signal for each channel including URx. The down ramp generator 1000 further generates a pulse on SYNCx just after DRx is reset high. A separate APP controller 1400 is provided for each channel, where "x" denotes the particular channel number as previously described. While PWMx and WAIT are both low, the comparator 1401 compares COMP with DRx and when either PWMx or WAIT is high, the comparator 1401 compares CMPx with URx. In general, then DRx falls to the level of COMP, the PWMx signal is asserted high and URx begins ramping up. The comparator 1401 switches to compare URx with CMPx. When URx reaches CMPx, the PWMx signal is asserted back low. If the PWMx signal is not asserted by the time DRx resets high again for the next cycle, the APP controller 1400 asserts the WAIT signal to suspend the DRx signal (and every other down ramp signal). This typically occurs when COMP is less than the lowest voltage of DRx. The DPDT switch 1403 switches so that the comparator 1401 compares CMPx with URx, where URx remains at its lowest level rather than ramping up. A PWMx pulse is initiated as soon as CMPx rises to the voltage of URx.

Figure 13:
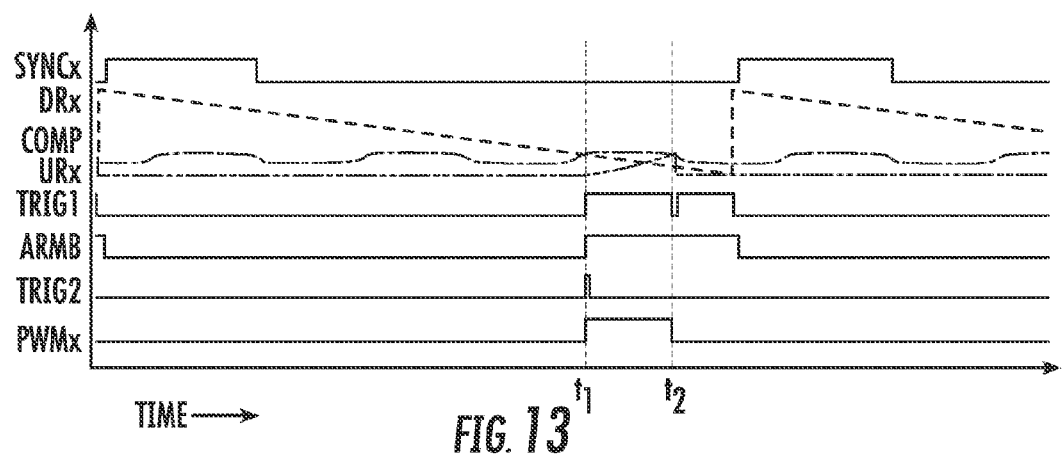
FIGS. 13, 14 and 15 are timing diagrams illustrating operation of the APP controller of FIG. 12 for various operating conditions.
Figure 14:
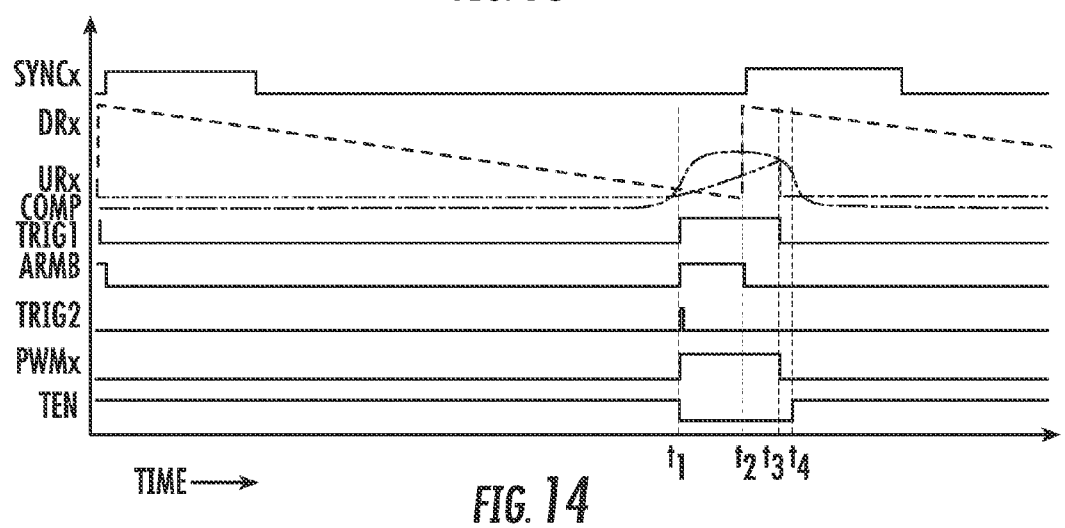
Figure 15:
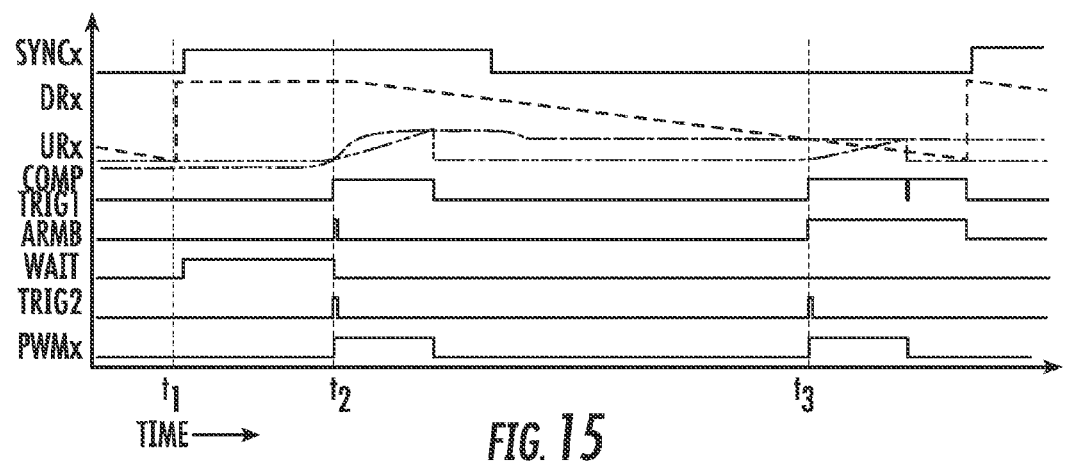

FIGS. 13, 14 and 15 are timing diagrams illustrating operation of the APP controller 1400 for various operating conditions. In each timing diagram, SYNCx is followed by DRx, COMP, and URx superimposed on top of each other, which is then followed by TRIG1, ARMB, TRIG2 and PWMx all plotted versus time. The timing diagrams are simplified in that CMPx is not shown, and URx is shown relative to COMP rather than CMPx. CMPx is an adjusted compensation signal which generally follows or is roughly equivalent to COMP so that the timing diagrams sufficiently illustrate operation. FIG. 13 illustrates normal operating mode under steady state load conditions. The DFF 1413 is initially in reset state so that ARMB is initially high holding the DFF 1415 in a reset state. SYNCx goes high just after DRx is reset high at the beginning of the cycle. Although not shown in the timing diagrams, PSYNC pulses high in response to SYNCx going high, and then goes back low. The DFF 1413 is set so that ARMB goes low in response to the pulse on PSYNC. While PSYNC is high, the AND gate 1407 is temporarily blocked from resetting the DFF 1413. It is noted that since ARMB is high when SYNCx goes high at the beginning of the cycle, the rising edge of SYNCx does not set the DFF 1415 since it is held in reset state, so that WAIT remains low. PWMx is initially low, so that the comparator 1401 compares DRx with COMP. When DRx ramps down to COMP at a time t1, the comparator 1401 asserts TRIG1 high. Since PSYNC is low, PWMxB is high and OK is high, the AND gate 1407 resets the DFF 1413 so that ARMB goes high. ARMB going high holds the DFF 1415 in reset state until the next cycle. TRIGx is pulsed high by the pulse generator 1419, which sets the RSFF 1421 high pulling PWMx high. While TRIG2 is pulsed high, the reset of the RSFF 1421 is blocked by the AND gate 1409. PWMx going high switches the DPDT switch 1403 so that the comparator 1401 is switched to compare URx with CMPx. While switching inputs, the comparator 1401 might otherwise output a pulse due to switching noise. The potential noise, however, is blocked by the AND gate 1409 from prematurely ending the PWM pulse. TRIG2 goes back low after a short delay through the pulse generator 1419. When URx rises to CMPx at about time t2, the comparator 1401 asserts TRIG1 back low and the AND gate 1409 resets the RSFF 1421 so that PWMx goes back low. PWMx going low changes back the DPDT switch 1403 so that comparator 1401 is coupled to COMP and DRx again, thus causing the comparator 1401 to go high again. Operation continues in similar manner for each cycle during normal operation.

FIG. 14 illustrates the case in which a pulse on PWMx begin in a first cycle of DRx and extends to a second and subsequent cycle. In this case, the PWMx signal goes high and URx begins ramping up as normal at about time t1, but towards the very end of the first DRx cycle. The pulse on PWMx extends through the next rising edge of SYNCx at about time t2, which is the point at which the DFF 1413 is set. The DFF 1413 is set as indicated by ARMB going low just after SYNCx goes high. Since TRIG1 is high (and OK is high and PSYNC is low), this might otherwise reset the DFF 1413 just after it was set thereby wasting a trigger while PWMx was already high, which would prevent a trigger later in the second DRx cycle. While PWMx remains high, PWMxB is low preventing the AND gate 1407 from resetting the DFF 1413. TRIG1 goes low when URx reaches CMP1 at subsequent time t3, which resets the RSFF 1421 pulling PWMx low and PWMxB high. After a short delay through the delay block 1423 at time t4, TEN goes high after TRIG1 went low preventing premature reset of the DFF 1413. The delay of the delay block 1423 also sets how closely a pulse on PWMx can be retriggered after having ended. In one embodiment, the delay is TSW/20.

FIG. 15 illustrates the case in which DRx does not reach COMP before resetting such that a pulse on PWMx is not achieved during a full cycle. As shown in FIG. 15, SYNCx goes high while ARMB is still low at about time t1 indicating that there was no pulse on PWMx during the previous cycle. Since ARMB is still low at the rising edge of SYNCx, the DFF 1415 gets set pulling WAIT high. The down ramp generator 1000 pauses the DRx signal (and any other down ramp signals) and the DPDT switch 1403 is switched so that the comparator 1403 monitors the URx signal compared with CMP1. The URx signal remains reset and low until the next pulse on PWMx, so that the comparator 1401 really compares CMP1 (or COMP) with the minimum voltage level of URx. When CMP1 (or COMP) rises above URx at about time t2, TRIG1 goes high, the AND gate 1407 resets the DFF 1413, ARMB goes high resetting the DFF 1415 so that WAIT is pulled back low, and a pulse is generated on TRIG2 setting the RSFF 1421 to initiate a pulse on PWMx. The DRx signal (and any other down ramp signals) resume normal operation. WAIT going low causes a high edge on the inverted Q output of the DFF 1415, which is delayed by the delay block 1417 and which then clocks the DFF 1413 pulling ARMB back low. In this manner, a normal PWMx pulse is enabled to occur later in the same cycle, such as shown at time t3.

Figure 16:
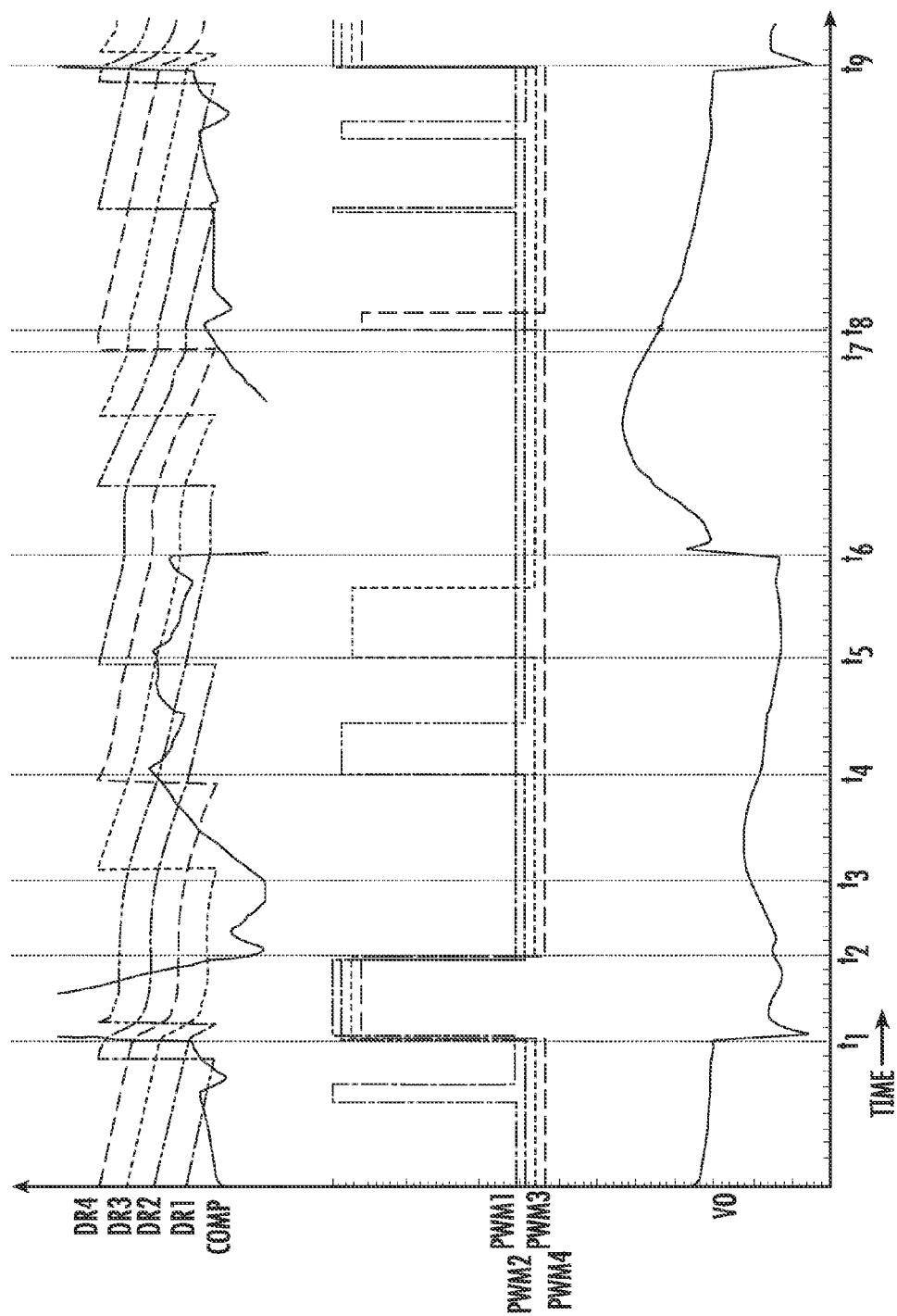
FIG. 16 is a timing diagram illustrating operation of a 4-channel APP regulator using the down ramp generator of FIG. 10 and the APP controller of FIG. 12 according to an exemplary embodiment.

FIG. 16 is a timing diagram illustrating operation of a 4-channel APP regulator using the down ramp generator 1000 and the APP controller 1400 according to an exemplary embodiment. The timing diagram is separated into three graphs, including an upper graph plotting DR1-DR4 and COMP superimposed on top of each other, a middle graph plotting PWM1-PWM4 on top of each other with slight offset to distinguish the individual pulses, and a lower graph plotting output voltage VO, all versus time. Again, only COMP is shown where it is understood that the CMP1-CMP4 signals generally track COMP and are used for comparison with corresponding up ramp UR1-UR4 signals, which are not shown. At a time t1, the COMP signal quickly spikes very high and VO drops quickly in response to a load condition, such as sudden increase of load current. Each of the PWM1-PWM4 signals pulse high at about the same time (in the order PWM2, PWM3, PWM4, PWM1) with about the same pulse width duration in response to the spike of COMP. The filter circuit 1001 responds to the sudden increase of COMP by increasing FCOMP and thus RCTL so that the slope of each of the down ramp signals DR1-DR4 increase. The pulses on the PWM1-PWM4 signals cause an increase of VO and a concomitant decrease of COMP, which causes termination of the PWM pulses at about time t2. In response to the sudden decrease of COMP, the filter circuit 1001 reduces RCTL so that the slopes of the ramp signals DR1-DR4 decrease after time t2 while COMP falls to a relatively low level. It is noted that in this case, the slope of DR1-DR4 decreases to less than that set by FS. At subsequent time t3, COMP begins rising and the slopes of DR1-DR4 increase accordingly. In this manner, changes of load conditions are sensed by the filter circuit 1001 for adjusting the slopes of the down ramp signals to adjust the pulses on the PWM1-PWM4 signals. The down ramp slopes are increased (or decreased) to adaptively reposition the pulses sooner (later) in time and to increase (decrease) operating frequency.

At subsequent time t4, COMP rises to DR2 causing a corresponding pulse on PWM2. It is noted that although COMP also crossed DR4 and DR1, PWM pulses had already occurred earlier in the same cycles for these down ramp signals so that pulses do not occur again on PWM4 and PWM1. At about time t5, COMP rises to DR3 causing a pulse on PWM3. Subsequently at about time t6, COMP drops very quickly (large negative change in voltage per time, or –dv/dt) and VO jumps higher very quickly, such as in response to a sudden decrease of output load condition. The slope of each of the down ramp signals DR1-DR4 decreases to zero or near zero while COMP is low for this embodiment. COMP begins rising again and the slopes of DR1-DR4 increase. Although COMP is rising, it stays below the minimum voltage level of the down ramps while the down ramp DR4 reaches its minimum level and resets back to its maximum level at about time t7 without a pulse on PWM4. WAIT is asserted and the down ramp signals DR1-DR4 are momentarily paused until a time t8 when COMP reaches the minimum level of the up ramp signals. It is noted that the slope of DR1-DR4 are at or near zero after time t7 until subsequent time t8. At time t8, COMP rises above the predetermined minimum voltage level so that WAIT is de-asserted low. When WAIT is de-asserted, the down ramps DR1-DR4 resume normal down ramping, and a pulse occurs on PWM4. Later at about time t9, a sudden increase in load causes another fast increase of COMP and corresponding pulses on the PMW1-PWM4 signals. It is noted that PWM4 also includes a second pulse during the same cycle of DR4 between times t7 and t9. It is appreciated that the wait function of the down ramp signals and operation of the APP controller 1400 keeps proper ordering of pulses on the PWM1-PWM4 signals. Thus, even though two pulses occur on PWM2 within the same cycle of DR4 because of the wait mode, pulses occur on PWM1-PWM3 in between the pulses on PWM4.

Figure 17:
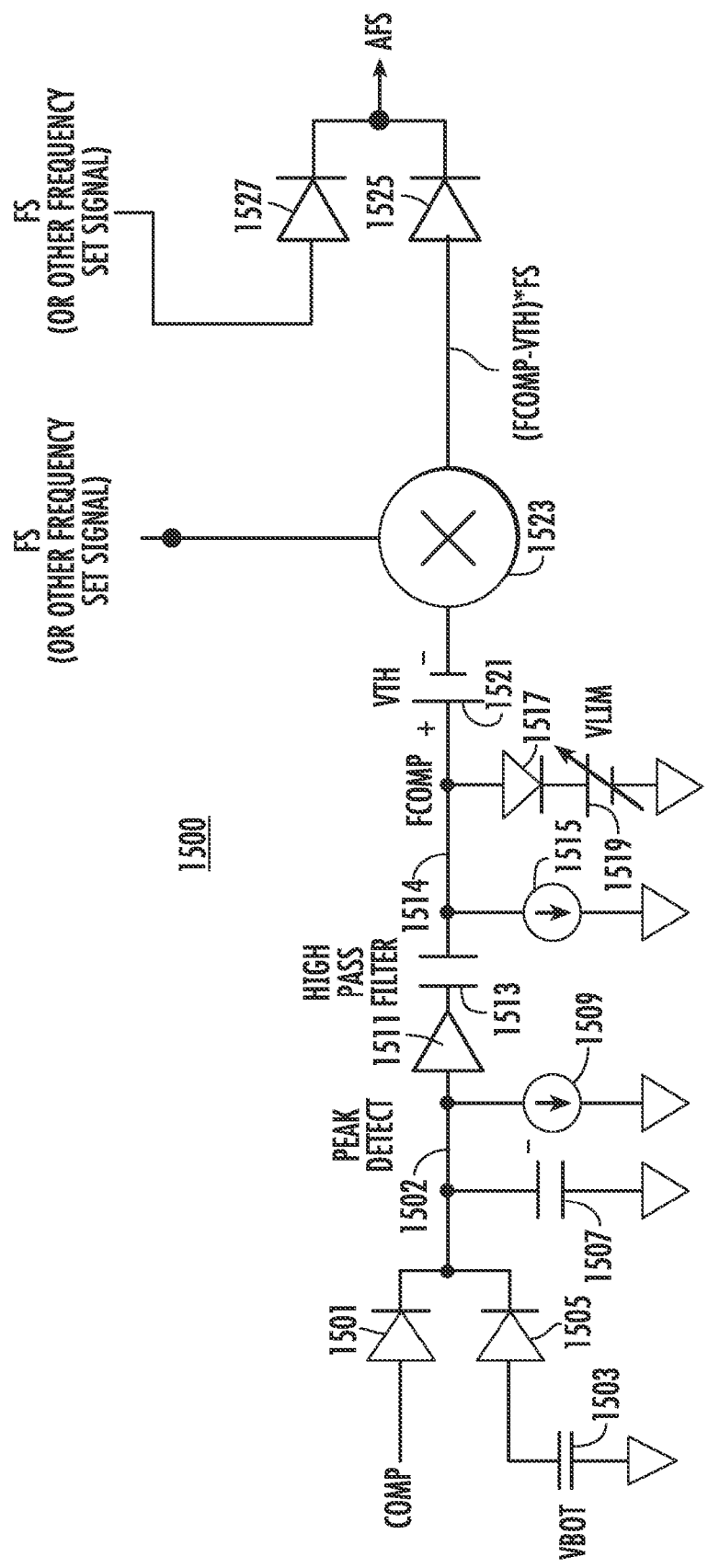
FIG. 17 is a schematic diagram of a speed up filter circuit according to an exemplary embodiment which replaces the filter circuit and combiner of FIG. 10.

FIG. 17 is a schematic diagram of a speed up filter circuit 1500 according to an exemplary embodiment which replaces the filter circuit 1000 and the combiner 1003 of FIG. 10. The speed up filter circuit 1500 enables the slopes of the down ramp signals to increase and decrease but does not allow the slopes of the down ramp signals to decrease below the level set by FS. The COMP signal is provided to the anode of a diode 1501, having a cathode coupled to a node 1502. A voltage source 1503 referenced to ground develops a voltage VBOT at the anode of another diode, having its cathode coupled to node 1502. Node 1502 is coupled to one end of a capacitor 1507, to an input of a current sink 1509, and to the input of a buffer 1511. The other end of the capacitor 1507 and the output of the current sink 1509 are coupled to ground. The output of the buffer 1511 is coupled to one end of a capacitor 1513, having its other end coupled to a node 1514. Node 1514 is coupled to an input of a current sink 1515, to the anode of a diode 1517, and to the positive terminal of a voltage source 1521 developing a threshold voltage VTH. The output of the current sink 1515 is coupled to ground and the cathode of the diode 1517 is coupled to the positive terminal of a voltage source 1519 developing a limit voltage VLIM. The negative terminal of the voltage source 1519 is coupled to ground. The negative terminal of the voltage source 1521 is coupled to one input of a multiplier 1523, having a second input receiving FS (or any other frequency set signal) and an output coupled to the anode of a diode 1525. FS (or any other frequency set signal) is provided to the anode of a diode 1527, and the cathodes of diodes 1525 and 1527 are coupled together at node 1528 developing the adjusted FS signal AFS. FS may be a voltage or a current signal in various embodiments as understood by those skilled in the art.

In operation of the speed up filter circuit 1500, the greater of COMP and VBOT is provided on node 1502 so that excursions of COMP below VBOT are ignored. The capacitor 1507 and current sink 1509 collectively operate as a peak detect circuit so that peak excursions of COMP are temporarily held at the output of the buffer 1511. The peak value is applied by the buffer 1511 to the capacitor 1513 and current sink 1515 collectively operating as a high pass filter asserting a filtered COMP voltage FCOMP on node 1514. The high pass filter function filters out DC or steady state conditions and passes changes of COMP as FCOMP. Also, FCOMP is limited to a maximum voltage level VLIM by the voltage source 1519. In one embodiment, VLIM is a 3/2's limiter or the like which limits the voltage of node 1514 to correspond to an average switching frequency of 3/2 FNOM. FCOMP is reduced by VTH to ignore relatively small changes of COMP below a threshold level. The multiplier 1523 multiplies FCOMP (or FCOMP−VTH) by FS (or any other frequency set signal) and provides a signal (FCOMP−VTH)*FS at its output. The gain of the multiplier 1523 is greater than or equal to one (or its output is prevented from dropping below zero). The higher of (FCOMP−VTH)*FS and FS is asserted on node 1528 as AFS used as the ramp control signal RCTL for controlling the current sinks 1008 of the down ramp generator 1000. In this manner, AFS is adjusted by changes of COMP but does not decrease below the minimum level established by FS. It is noted that the current sinks 1509 and 1515 may be made to track FS so that the filter functions track the switching frequency. Note also that VLIM may be dynamically adjusted by a circuit (not shown) that monitors, for instance, the average switching frequency.

Figure 18:
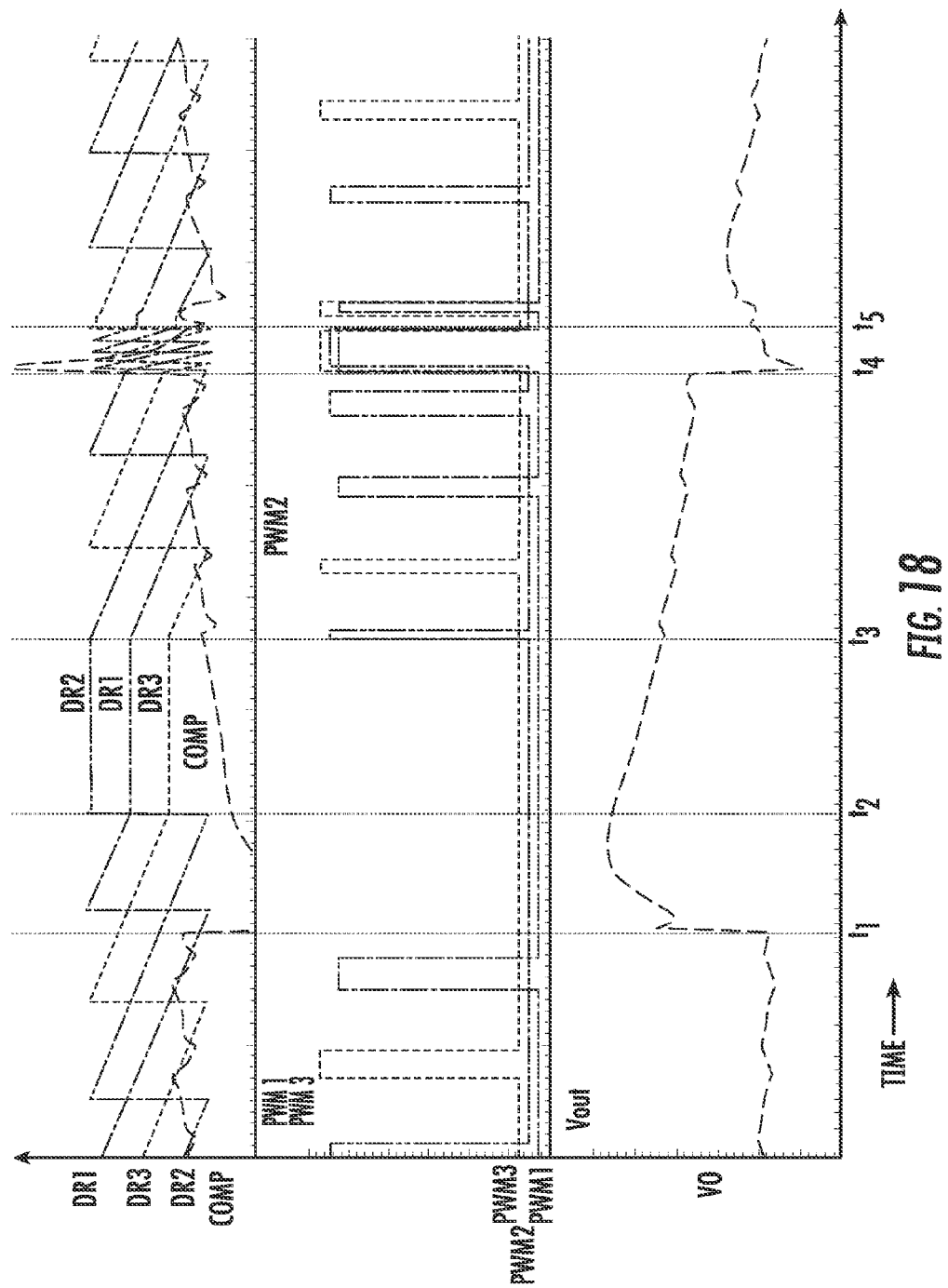

FIG. 18 is a timing diagram illustrating operation of a 3-channel APP regulator using the down ramp generator 1000 with the speed up filter circuit 1500, and further using the APP controller 1400 according to an exemplary embodiment. The timing diagram is separated into three graphs, including an upper graph plotting DR1-DR3 and COMP superimposed on top of each other, a middle graph plotting PWM1-PWM3 on top of each other with slight offset to distinguish the individual pulses, and a lower graph plotting output voltage VO, all versus time. Again, only COMP is shown where it is understood that the CMP1-CMP3 signals generally track COMP. Also, the up ramp signals UR1-UR3 are not shown. Operation is similar to that shown in FIG. 16 except that only 3 channels are implemented and the speed up filter circuit 1500 controls slope changes of the down ramp signals DR1-DR3. Operation proceeds at steady state until a sudden load decrease at about time t1 causing a sudden decrease of the COMP signal. In this case, the slopes of the down ramp signals DR1-DR3 do not decrease but maintain steady state operation based on FS. At time t2, COMP is increasing but has not risen to the minimum level of the up ramp signals and DR2 completes a cycle without a pulse on PWM2. Thus, beginning at time t2, the WAIT signal is asserted until time t3 when COMP reaches the up ramp voltage (or other minimum voltage level) and a pulse is asserted on PWM2. The down ramps resume normal down ramping after time t3 and COMP remains relatively stable. Operation continues normally until a subsequent time t4 when COMP rises suddenly in response to a sudden increase in load. The down ramp slopes are increased and the frequency of operation increases from time t4 to a time t5 when COMP drops to within normal operating range and the output voltage VO is stabilized.

FIG. 19 is a timing diagram plotting the same signals as FIG. 18 focusing in on operation between times t4 and t5. As shown, at time t4 COMP increases and the slopes and frequency of the down ramp signals increase until time t5. After time t5 a short wait is encountered due to the deadtime timer function of the delay block 1423.

Although the present invention has been described in considerable detail with reference to certain preferred versions thereof, other versions and variations are possible and contemplated. For example, the ramps and comparators can be inverted, the signals can be copied and offset for purposes of realization, the control method can be mapped into an equivalent digital control scheme, etc. The present invention is applicable to a number of synchronous and asynchronous switching regulator topologies. Further, the polarities can be interchanged for negative voltage regulators. Those skilled in the art should appreciate that they can readily use the disclosed conception and specific embodiments as a basis for designing or modifying other structures for providing out the same purposes of the present invention without departing from the spirit and scope of the invention as defined by the following claims.

What is claimed is:

1. An adaptive pulse positioning modulator for controlling a regulated output voltage, comprising:

a sense circuit which provides a compensation signal indicative of output voltage error;

a filter circuit having an input receiving said compensation signal and an output providing an adjust signal;

a leading ramp circuit which provides a repetitive first leading edge ramp signal having a slope at a nominal level when said compensation signal is steady state and which adjusts said slope based on said adjust signal;

a comparator circuit which provides a first start trigger signal when said first leading edge ramp signal reaches said compensation signal and which provides a first end trigger signal when a first trailing edge ramp signal reaches said compensation signal;

a trailing ramp circuit which initiates ramping of said first trailing edge ramp signal when said first start trigger signal is provided; and pulse control logic which initiates each pulse on a first pulse-width modulation (PWM) signal when said first start trigger signal is provided and which terminates each said pulse on said first PWM signal when said first end trigger signal is provided.

2. The adaptive pulse positioning modulator of claim 1, wherein said sense circuit comprises an error amplifier which provides said compensation signal indicative of error of said output voltage.

3. The adaptive pulse positioning modulator of claim 1, wherein said leading ramp circuit comprises a down ramp generator and wherein said trailing ramp circuit comprises an up ramp generator.

4. The adaptive pulse positioning modulator of claim 1, wherein said filter circuit controls said adjust signal to increase said slope in response to an increase of said compensation signal and to decrease said slope in response to a decrease of said compensation signal.

5. The adaptive pulse positioning modulator of claim 4, wherein said filter circuit prevents said slope from falling below a predetermined minimum level.

6. The adaptive pulse positioning modulator of claim 1, wherein said leading ramp circuit provides a number N of repetitive leading edge ramp signals each having said slope at said nominal level when said compensation signal is steady state and which adjusts said slope based on said adjust signal, wherein N is an integer greater than one, wherein said leading ramp circuit ramps each of said leading edge ramp signals within a voltage range from a first voltage to a second voltage and then resets each of said leading edge ramp signals back to said first voltage, and wherein said leading ramp circuit resets said N leading edge ramp signals in round-robin order separated by 1/Nth of said voltage range.

7. The adaptive pulse positioning modulator of claim 6, further comprising:
  said comparator circuit providing one of N start trigger signals when a corresponding one of said N leading edge ramp signals reaches said compensation signal and providing one of N end trigger signals when a corresponding one of N trailing edge ramp signals reaches said compensation signal;
  said trailing ramp circuit initiating ramping one of said N trailing edge ramp signals when a corresponding one of said N start trigger signals is provided;
  said pulse control logic initiating each pulse on a corresponding one of N PWM signals when a corresponding one of said N start trigger signals is provided and terminating each pulse on said corresponding PWM signal when a corresponding one of said N end trigger signals is provided; and
  wait logic which pauses each of said N leading edge ramp signals when any one of said N PWM signals is not provided between successive resets of a corresponding one of said N leading edge ramp signals.

8. The adaptive pulse positioning modulator of claim 7, wherein said wait logic resumes ramping of each of said N leading edge ramp signals when said compensation signal rises to a predetermined minimum level.

9. The adaptive pulse positioning modulator of claim 8, wherein said pulse control logic maintains said round-robin order.

10. The adaptive pulse positioning modulator of claim 7, wherein said filter circuit controls said adjust signal to change said slope in response to a change of said compensation signal and wherein said filter circuit prevents said slope from falling below a predetermined minimum level except when said wait logic pauses each of said N leading edge ramp signals.

11. A power converter for providing a regulated output voltage, comprising:
  a first phase circuit controlled by pulses on a first pulse width modulation (PWM) signal for converting an input voltage to the output voltage via a first inductor;
  a sense circuit which provides a compensation signal indicative of output voltage error;
  a filter circuit having an input receiving said compensation signal and an output providing an adjust signal; and
  an adaptive pulse positioning modulator, comprising:
    a leading ramp circuit which provides a repetitive first leading edge ramp signal having a slope at a nominal level when said compensation signal is steady state and which adjusts said slope based on said adjust signal;
    a comparator circuit which provides a first start trigger signal when said first leading edge ramp signal reaches said compensation signal and which provides a first end trigger signal when a first trailing edge ramp signal reaches said compensation signal;
    a trailing ramp circuit which initiates ramping of said first trailing edge ramp signal when said first start trigger signal is provided; and
    pulse control logic which initiates each pulse on said first PWM signal when said first start trigger signal is provided and which terminates each said pulse on said first PWM signal when said first end trigger signal is provided.

12. The power converter of claim 11, wherein said filter circuit controls said adjust signal to increase said slope in response to an increase of said compensation signal and to decrease said slope in response to a decrease of said compensation signal.

13. The power converter of claim 12, wherein said filter circuit prevents said slope from falling below a predetermined minimum level.

14. The power converter of claim 11, further comprising:
  a number N of phase circuits, each controlled by pulses on a corresponding one of N PWM signals for converting said input voltage to said output voltage via a corresponding one of N inductors, wherein N is an integer greater than one; and
  wherein said adaptive pulse positioning modulator comprises:
    said leading ramp circuit providing N repetitive leading edge ramp signals each having said slope at said nominal level when said compensation signal is steady state and which adjusts said slope based on said adjust signal, wherein said leading ramp circuit ramps each of said leading edge ramp signals within a voltage range from a first voltage to a second voltage and then resets each of said leading edge ramp signals back to said first voltage, and wherein said leading ramp circuit resets said N leading edge ramp signals in round-robin order separated by 1/Nth of said voltage range;
    said comparator circuit providing one of N start trigger signals when a corresponding one of said N leading edge ramp signals reaches said compensation signal and providing one of N end trigger signals when a corresponding one of N trailing edge ramp signals reaches said compensation signal;
    said trailing ramp circuit initiating ramping one of said N trailing edge ramp signals when a corresponding one of said N start trigger signals is provided;
    said pulse control logic initiating each pulse on a corresponding one of N PWM signals when a corresponding one of said N start trigger signals is provided and terminating each pulse on said corresponding PWM signal when a corresponding one of said N end trigger signals is provided; and
    wait logic which pauses each of said N leading edge ramp signals when any one of said N PWM signals is not provided between successive resets of a corresponding one of said N leading edge ramp signals.

15. The power converter of claim 14, wherein said wait logic resumes ramping of each of said N leading edge ramp signals when said compensation signal rises to a predetermined minimum level.

16. The power converter of claim 15, wherein said pulse control logic maintains said round-robin order.

17. A method of controlling a DC-DC converter providing a regulated output voltage, comprising:

provide a compensation signal indicative of the output voltage error;

filtering the compensation signal and providing an adjust signal indicative of a changes of the compensation signal;

providing a repetitive first leading edge ramp signal having a slope at a nominal level when the compensation signal is steady state;

adjusting the slope of the first leading edge ramp signal based on the adjust signal;

providing a first start trigger signal when the first leading edge ramp signal reaches the compensation signal;

providing a first end trigger signal when a first trailing edge ramp signal reaches the compensation signal;

initiating ramping of said the trailing edge ramp signal when the first start trigger signal is provided;

initiating each pulse on a first pulse-width modulation (PWM) signal when the first start trigger signal is provided and terminating each pulse on the first PWM signal when the first end trigger signal is provided.

18. The method of claim 17, wherein said adjusting the slope of the first leading edge ramp signal based on the adjust signal comprises increasing the slope in response to an increase of the compensation signal and decreasing the slope in response to a decrease of the compensation signal.

19. The method of claim 17, wherein said adjusting the slope of the first leading edge ramp signal based on the adjust signal comprises changing the slope in response to changes of the compensation signal while preventing the slope from falling below a predetermined minimum level.

20. The method of claim 17, further comprising:

said providing a repetitive first leading edge ramp signal comprising providing N repetitive leading edge ramp signals each having the slope at the nominal level when the compensation signal is steady state, wherein N is a positive integer greater than one;

ramping each of the leading edge ramp signals within a voltage range from a first voltage to a second voltage;

resetting each of the N leading edge ramp signals back to the first voltage after reaching the second voltage in round-robin order and separated by 1/Nth of the voltage range;

said adjusting comprising adjusting the slope of each of the N leading edge ramp signals based on the adjust signal;

said providing a first start trigger signal comprising providing one of N start trigger signals when a corresponding one of the N leading edge ramp signals reaches the compensation signal and providing one of N end trigger signals when a corresponding one of N trailing edge ramp signals reaches the compensation signal;

said initiating ramping comprising initiating ramping one of the N trailing edge ramp signals when a corresponding one of the N start trigger signals is provided;

said initiating each pulse comprising initiating each pulse on a corresponding one of N PWM signals when a corresponding one of the N start trigger signals is provided and terminating each pulse on the corresponding PWM signal when a corresponding one of the N end trigger signals is provided; and pausing each of the N leading edge ramp signals when any one of the N PWM signals is not provided between successive resets of a corresponding one of the N leading edge ramp signals.

21. The method of claim 20, further comprising resuming ramping of each of the N leading edge ramp signals when the compensation signal rises to a predetermined minimum level.

22. The method of claim 21, further comprising maintaining the round-robin ordering.

\* \* \* \* \*